United States Patent
Kim

(10) Patent No.: US 12,283,303 B2
(45) Date of Patent: Apr. 22, 2025

(54) ELECTRONIC DEVICE PERFORMING REFRESH OPERATION

(71) Applicant: SK hynix Inc., Icheon-si (KR)

(72) Inventor: Dae Joon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 315 days.

(21) Appl. No.: 17/733,317

(22) Filed: Apr. 29, 2022

(65) Prior Publication Data
US 2023/0215485 A1 Jul. 6, 2023

(30) Foreign Application Priority Data
Jan. 4, 2022 (KR) .................. 10-2022-0001200

(51) Int. Cl.
G11C 11/406 (2006.01)
G11C 11/408 (2006.01)
G11C 11/4096 (2006.01)

(52) U.S. Cl.
CPC .. G11C 11/40615 (2013.01); G11C 11/40622 (2013.01); G11C 11/4085 (2013.01); G11C 11/4096 (2013.01)

(58) Field of Classification Search
CPC ........................... G11C 11/401–4099
See application file for complete search history.

(56) References Cited

U.S. PATENT DOCUMENTS

2021/0158862 A1* 5/2021 Okuma ............ G11C 11/40611

OTHER PUBLICATIONS

Woong Rae Kim, KR 2021-0007434, Jan. 19, 2021, SK hynix Inc., Republic of Korea.

* cited by examiner

Primary Examiner — Alfredo Bermudez Lozada
(74) Attorney, Agent, or Firm — WILLIAM PARK & ASSOCIATES LTD.

(57) ABSTRACT

An electronic device includes a count signal generation circuit configured to increase one of the values of a weak cell count signal and an active count signal by comparing a weak cell address with an adjacent address generated from a row address, when an active operation is performed. The electronic device also includes a target refresh control circuit configured to latch the adjacent address based on the values of the weak cell count signal and the active count signal and to output the latched adjacent address as a target address for a refresh operation based on a target refresh signal.

8 Claims, 18 Drawing Sheets

ELECTRONIC DEVICE PERFORMING REFRESH OPERATION

CROSS-REFERENCE TO RELATED APPLICATION

The present application claims priority under 35 U.S.C. § 119(a) to Korean application number 10-2022-0001200, filed in the Korean Intellectual Property Office on Jan. 4, 2022, the entire disclosure of which is incorporated herein by reference.

BACKGROUND

The present disclosure relates to an electronic device which performs a refresh operation.

Among memory devices, in the case of DRAM, when an active operation is repeatedly performed on a specific word line, a row hammer phenomenon in which data is lost, the data being stored in a memory cell coupled to a word line adjacent to the specific word line, may occur. The DRAM can reduce the row hammer phenomenon by performing a refresh operation of re-storing data in the memory cell coupled to the word line adjacent to the specific word line.

SUMMARY

Some embodiments of the present disclosure are directed to an electronic device which performs a refresh operation.

In an embodiment, an electronic device may include a count signal generation circuit configured to increase one of values of a weak cell count signal and an active count signal by comparing a weak cell address with an adjacent address generated from a row address, when an active operation is performed. The electronic device may also include a target refresh control circuit configured to latch the adjacent address based on the values of the weak cell count signal and the active count signal and to output the latched adjacent address as a target address for a refresh operation based on a target refresh signal.

In an embodiment, an electronic device may include a count signal generation circuit configured to increase one of values of a weak cell count signal and an active count signal by comparing a weak cell address with an adjacent address generated from a row address, when an active operation is performed. The electronic device may also include a target refresh control circuit configured to latch the adjacent address based on the weak cell count signal, latch an adjacent sampling address generated from the row address based on the active count signal, and output the latched adjacent address or the latched adjacent sampling address as a target address for a refresh operation based on a target refresh signal.

In an embodiment, an electronic device may include a count signal generation circuit configured to increase a value of at least one of a weak cell count signal, a weak cell extension count signal, and an active count signal by comparing a weak cell address with an adjacent address and extension adjacent address generated from a row address, when an active operation is performed. The electronic device may also include a target refresh control circuit configured to latch the adjacent address based on the weak cell count signal and the active count signal, latch the extension adjacent address based on the weak cell extension count signal, and output the latched adjacent address or the latched extension adjacent address as a target address for a refresh operation based on a target refresh signal.

According to the present disclosure, a row hammer phenomenon for a weak cell among memory cells can be reduced by more closely monitoring whether a word line to which a weak cell is coupled is adjacent to a word line activated upon active operation, compared to a word line to which a normal memory cell is coupled.

DETAILED DESCRIPTION

In the descriptions of the following examples, the term "preset" indicates that the numerical value of a parameter is previously determined, when the parameter is used in a process or algorithm. According to an example, the numerical value of the parameter may be set when the process or algorithm is started or while the process or algorithm is being performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Figure 1:
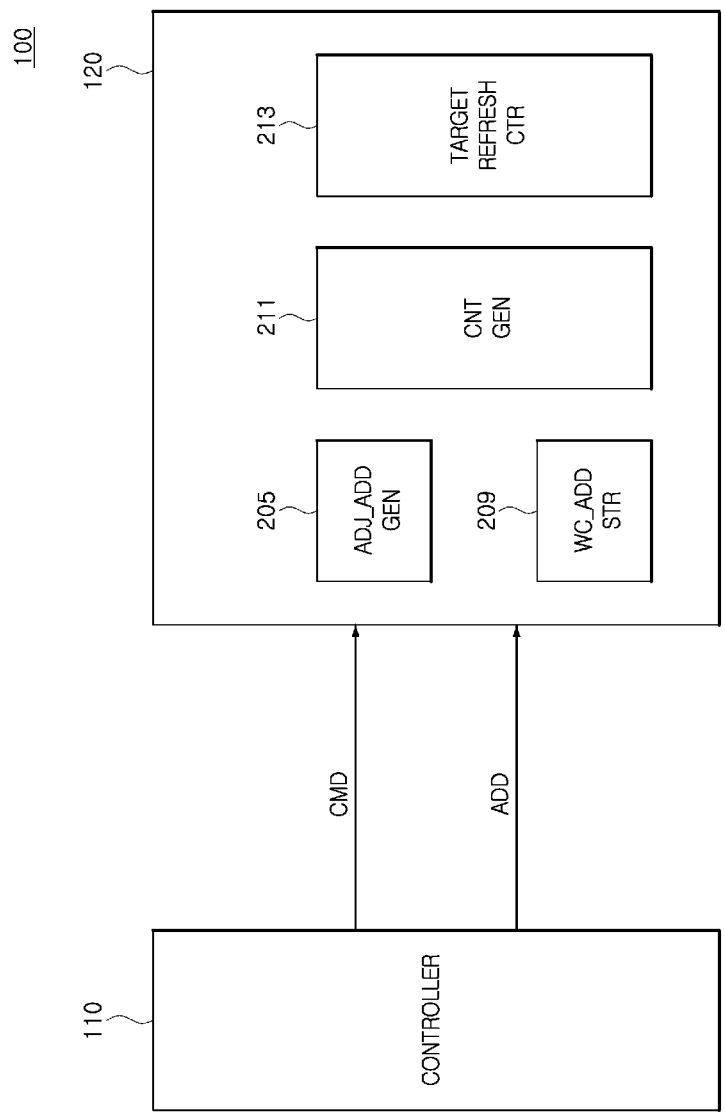
FIG. 1 is a block diagram illustrating a configuration of an electronic system according to an example of the present disclosure.

FIG. 1 is a block diagram illustrating a configuration of an electronic system 100 according to an example of the present disclosure. As illustrated in FIG. 1, the electronic system 100 may include a controller 110 and an electronic device 120. In the present embodiment, the electronic device 120 may be implemented as a memory device. The controller 110 may transmit a command CMD and an address ADD to the electronic device 120. The electronic device 120 may receive the command CMD and the address ADD and perform various internal operations, such as an active operation and a refresh operation.

The electronic device 120 may include an adjacent address generation circuit (ADJ_ADD GEN) 205, a weak cell address storage circuit (WC_ADD STR) 209, a count signal generation circuit (CNT GEN) 211, and a target refresh control circuit (TARGET REFRESH CTR) 213.

When receiving the command CMD for an active operation, the adjacent address generation circuit 205 may generate an adjacent address corresponding to a word line adjacent to a word line activated upon active operation, based on the address ADD.

The weak cell address storage circuit 209 may store a weak cell address corresponding to a word line to which a weak cell is coupled. The weak cell may be defined as a memory cell that belongs to memory cells included in the electronic device 120 and whose characteristic in which data is retained is determined to be relatively low through a test.

The count signal generation circuit 211 may compare a weak cell address, stored in the weak cell address storage circuit 209, with an adjacent address generated by the adjacent address generation circuit 205. The count signal generation circuit 211 may count the number of active operations executed for each weak cell address when a value of the weak cell address is identical with a value of an adjacent address. On the contrary, when a value of a weak cell address is different from a value of an adjacent address, the count signal generation circuit 211 may separately count the number of active operations executed.

The target refresh control circuit 213 may control a refresh operation to be performed on a memory cell coupled to a word line adjacent to a word line repeatedly activated based on the number of active operations executed that is counted for each weak cell address and the number of active operations executed that is separately counted.

Accordingly, the electronic device 120 can reduce a row hammer phenomenon for a weak cell among memory cells by more closely monitoring whether a word line to which a weak cell is coupled is adjacent to an activated word line, compared to a word line to which a normal memory cell is coupled.

Figure 2:
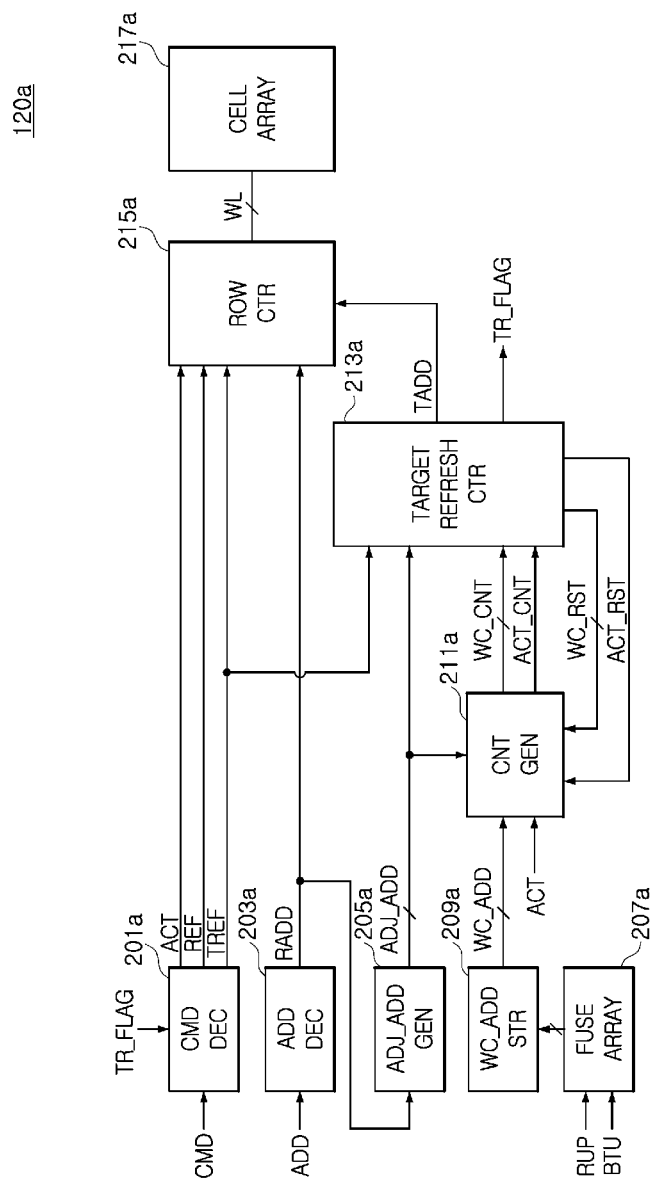
FIG. 2 is a block diagram illustrating a configuration according to an example of the electronic device illustrated in FIG. 1.

FIG. 2 is a block diagram illustrating a configuration according to an example of the electronic device 120 illustrated in FIG. 1. As illustrated in FIG. 2, an electronic device 120a may include a command decoder (CMD DEC) 201a, an address decoder (ADD DEC) 203a, an adjacent address generation circuit (ADJ_ADD GEN) 205a, a fuse array 207a, a weak cell address storage circuit (WC_ADD STR) 209a, a count signal generation circuit (CNT GEN) 211a, a target refresh control circuit (TARGET REFRESH CTR) 213a, a row control circuit (ROW CTR) 215a, and a cell array 217a.

The command decoder 201a may generate an active signal ACT for performing an active operation, a refresh signal REF for performing a refresh operation, and a target refresh signal TREF for performing a refresh operation on a target address TADD, by decoding the command CMD based on a target refresh flag TR_FLAG. The command decoder 201a may activate the active signal ACT by decoding the command CMD for performing an active operation. When the target refresh flag TR_FLAG is deactivated, the command decoder 201a may activate the refresh signal REF by decoding the command CMD for performing a refresh operation. The command decoder 201a may activate the target refresh signal TREF by decoding the command CMD for performing a refresh operation in an interval of time during which the target refresh flag TR_FLAG is activated.

The address decoder 203a may generate a row address RADD by decoding the address ADD. The row address RADD may be generated when an active operation is performed. The row address RADD may have a value corresponding to a word line WL. For example, a value of the row address RADD may be set as "X" when the value corresponds to an X-th word line WL<X>, may be set as "X−1" when the value corresponds to an (X−1)-th word line WL<X−1>, and may be set as "X+1" when the value corresponds an (X+1)-th word line WL<X+1>.

The adjacent address generation circuit 205a may generate an adjacent address ADJ_ADD based on the row address RADD. The adjacent address ADJ_ADD may include a first adjacent address ADJ_ADD<1> and a second adjacent address ADJ_ADD<2>. The adjacent address generation circuit 205a may generate the first adjacent address ADJ_ADD<1> by subtracting "1" from a value of the row address RADD, and may generate the second adjacent address ADJ_ADD<2> by adding "1" to the value of the row address RADD. For example, when the row address RADD has a value "X," the adjacent address generation circuit 205a may generate the first adjacent address ADJ_ADD<1> having a value "X−1" by subtracting "1" from the value "X," and may generate the second adjacent address ADJ_ADD<2> having a value "X+1" by adding "1" to the value "X." That is, the first adjacent address ADJ_ADD<1> and the second adjacent address ADJ_ADD<2> may correspond to an (X−1)-th word line WL<X−1> and an (X+1)-th word line WL<X+1>, respectively, which are adjacent to an X-th word line WL<X> activated based on the row address RADD upon active operation.

The fuse array 207a may include an electrically programmable e-fuse. The fuse array 207a may program a weak cell address WC_ADD into the e-fuse based on a rupture command RUP based on a result of the test of a data retention characteristic of a memory cell included in the cell array 217a. The weak cell address WC_ADD may include first to N-th weak cell addresses WC_ADD<1:N> having values corresponding to respective word lines to which a weak cell is coupled ("N" is a natural number equal to or greater than 2). When a bootup operation is performed based on a bootup command BTU, the fuse array 207a may output a programmed weak cell address WC_ADD to the weak cell address storage circuit 209a. The rupture command RUP and the bootup command BTU may be generated based on the command CMD.

When a bootup operation is performed, the weak cell address storage circuit 209a may store and output the weak cell address WC_ADD received from the fuse array 207a.

The count signal generation circuit 211a may generate a weak cell count signal WC_CNT and an active count signal ACT_CNT by comparing the weak cell address WC_ADD with the adjacent address ADJ_ADD based on the active signal ACT, a weak cell count reset signal WC_RST, and an active count reset signal ACT_RST. The weak cell count signal WC_CNT may include first to N-th weak cell count signals WC_CNT<1:N> corresponding to the first to N-th weak cell addresses WC_ADD<1:N>, respectively. The weak cell count reset signal WC_RST may include first to N-th weak cell count reset signals WC_RST<1:N> activated in order to reset values of the first to N-th weak cell count signals WC_CNT<1:N>, respectively. The active count reset signal ACT_RST may be activated in order to reset a value of the active count signal ACT_CNT.

The count signal generation circuit 211a may increase one of the values of the weak cell count signal WC_CNT and the active count signal ACT_CNT based on a result of a comparison between the weak cell address WC_ADD and the adjacent address ADJ_ADD, when an active operation is performed based on the active signal ACT.

The count signal generation circuit 211a may increase a value of the weak cell count signal WC_CNT when a value of the weak cell address WC_ADD is identical with a value of the adjacent address ADJ_ADD in an active operation. For example, the count signal generation circuit 211a may increase a value of the first weak cell count signal WC_CNT<1> when a value of the first weak cell address WC_ADD<1> is identical with one of the values of the first adjacent address ADJ_ADD<1> and the second adjacent address ADJ_ADD<2> in an active operation. For another example, the count signal generation circuit 211a may increase a value of the second weak cell count signal WC_CNT<2> when a value of the second weak cell address WC_ADD<2> is identical with one of the values of the first adjacent address ADJ_ADD<1> and the second adjacent address ADJ_ADD<2> in an active operation. Accordingly, the count signal generation circuit 211a may closely monitor a row hammer phenomenon for a weak cell by counting the number of active operations executed for each weak cell address WC_ADD, whenever a word line to which a weak cell is coupled is adjacent to a word line activated upon active operation.

The count signal generation circuit 211a may increase a value of the active count signal ACT_CNT when a value of the weak cell address WC_ADD is different from a value of the adjacent address ADJ_ADD in an active operation. For example, the count signal generation circuit 211a may increase a value of the active count signal ACT_CNT when both values of the first weak cell address WC_ADD<1> and the second weak cell address WC_ADD<2> are different from values of the first adjacent address ADJ_ADD<1> and the second adjacent address ADJ_ADD<2>, respectively, in an active operation. Accordingly, the count signal generation circuit 211a can integratedly monitor a row hammer phenomenon for memory cells not determined as weak cells, by separately counting the number of active operations executed, whenever a word line to which a weak cell is coupled is not adjacent to a word line activated upon active operation. A configuration and operation of the count signal generation circuit 211a are specifically described later with reference to FIG. 3.

The target refresh control circuit 213a may generate the target address TADD, the target refresh flag TR_FLAG, the weak cell count reset signal WC_RST, and the active count reset signal ACT_RST based on the weak cell count signal WC_CNT, the active count signal ACT_CNT, the target refresh signal TREF, and the adjacent address ADJ_ADD. The target address TADD may be generated in order to perform a refresh operation when the target refresh signal TREF is activated.

The target refresh control circuit 213a may latch the adjacent address ADJ_ADD based on the weak cell count signal WC_CNT and the active count signal ACT_CNT, and may output a latched adjacent address ADJ_ADD to the target address TADD based on the target refresh signal TREF. The target refresh control circuit 213a may latch the adjacent address ADJ_ADD based on values of the weak cell count signal WC_CNT and the active count signal ACT_CNT. More specifically, the target refresh control circuit 213a may latch the adjacent address ADJ_ADD, when at least one of the first to N-th weak cell count signals WC_CNT<1:N> has a first threshold value or the active count signal ACT_CNT has a second threshold value. The first threshold value and the second threshold value may be variously set in different embodiments. The target refresh control circuit 213a may output at least one of latched adjacent addresses ADJ_ADD as the target address TADD, when the target refresh signal TREF is activated.

The target refresh control circuit 213a may generate the target refresh flag TR_FLAG, based on the weak cell count signal WC_CNT, the active count signal ACT_CNT, and the target refresh signal TREF. More specifically, when at least one of the first to N-th weak cell count signals WC_CNT<1:N> has a first threshold value or the active count signal ACT_CNT has a second threshold value, the target refresh control circuit 213a may activate the target refresh flag TR_FLAG. The target refresh control circuit 213a may deactivate an activated target refresh flag TR_FLAG based on the target refresh signal TREF.

The target refresh control circuit 213a may activate the first to N-th weak cell count reset signals WC_RST<1:N> respectively corresponding to the first to N-th weak cell count signals WC_CNT<1:N> each having a first threshold value. When the active count signal ACT_CNT has a second threshold value, the target refresh control circuit 213a may activate the active count reset signal ACT_RST. A configuration and operation of the target refresh control circuit 213a are specifically described later with reference to FIG. 4.

When the active signal ACT is activated, the row control circuit 215a may activate a word line WL corresponding to a value of the row address RADD, and may perform an active operation of sensing and amplifying data stored in a memory cell coupled to the activated word line WL. When the refresh signal REF is activated, the row control circuit 215a may activate at least one word line WL, and may perform a refresh operation of sensing and amplifying data stored in a memory cell coupled to the activated at least one word line WL. When the target refresh signal TREF is activated, the row control circuit 215a may activate a word line WL corresponding to a value of the target address TADD, and may perform a refresh operation of sensing and amplifying data stored in a memory cell coupled to the activated word line WL.

The cell array 217a may include multiple memory cells coupled to word lines WL, respectively, and be configured to store data.

Figure 3:
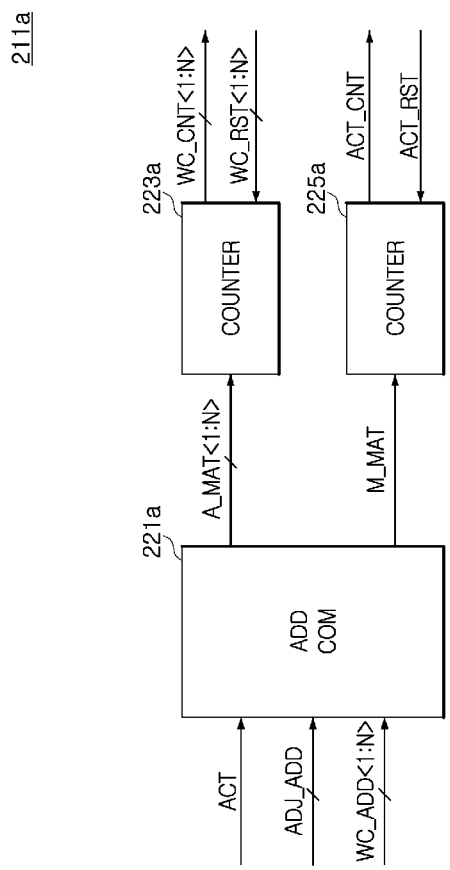
FIG. 3 is a block diagram illustrating a configuration according to an example of a count signal generation circuit illustrated in FIG. 2.

FIG. 3 is a block diagram illustrating a configuration according to an example of the count signal generation circuit 211a illustrated in FIG. 2. As illustrated in FIG. 3, the count signal generation circuit 211a may include an address comparison circuit (ADD COM) 221a, a first counter 223a, and a second counter 225a.

When an active operation is performed based on the active signal ACT, the address comparison circuit 221a may generate first to N-th address match signals A_MAT<1:N> and a mismatch signal M_MAT by comparing each of the first to N-th weak cell addresses WC_ADD<1:N> with the adjacent address ADJ_ADD.

When at least one of the values of the first to N-th weak cell addresses WC_ADD<1:N> is identical with a value of the adjacent address ADJ_ADD, the address comparison circuit 221a may activate at least one of the first to N-th address match signals A_MAT<1:N>. For example, when a value of the first weak cell address WC_ADD<1> is identical with one of the values of the first adjacent address ADJ_ADD<1> and the second adjacent address ADJ_ADD<2>, the address comparison circuit 221a may activate the first address match signal A_MAT<1>. Furthermore, for example, when a value of the second weak cell address WC_ADD<2> is identical with one of the values of the first adjacent address ADJ_ADD<1> and the second adjacent address ADJ_ADD<2>, the address comparison circuit 221a may activate the second address match signal A_MAT<2>.

When each of the values of the first to N-th weak cell addresses WC_ADD<1:N> is different from a value of the adjacent address ADJ_ADD, the address comparison circuit 221a may activate the mismatch signal M_MAT. For example, when each of the values of the first weak cell address WC_ADD<1> and the second weak cell address WC_ADD<2> is different from each of the values of the first adjacent address ADJ_ADD<1> and the second adjacent address ADJ_ADD<2>, the address comparison circuit 221a may activate the mismatch signal M_MAT.

The first counter 223a may increase each of the values of the first to N-th weak cell count signals WC_CNT<1:N> by counting the input of each of the first to N-th address match signals A_MAT<1:N>. For example, the first counter 223a may increase a value of the first weak cell count signal WC_CNT<1> by "1" whenever the first address match signal A_MAT<1> is activated. Furthermore, for example, the first counter 223a may increase a value of the second weak cell count signal WC_CNT<2> by "1" whenever the second address match signal A_MAT<2> is activated. The first counter 223a may reset values of the first to N-th weak cell count signals WC_CNT<1:N> corresponding to the first to N-th weak cell count reset signals WC_RST<1:N>, respectively.

The second counter 225a may increase a value of the active count signal ACT_CNT by counting the input of the mismatch signal M_MAT. For example, the second counter 225a may increase a value of the active count signal ACT_CNT by "1" whenever the mismatch signal M_MAT is activated. The second counter 225a may reset a value of the active count signal ACT_CNT when the active count reset signal ACT_RST is activated.

Figure 4:
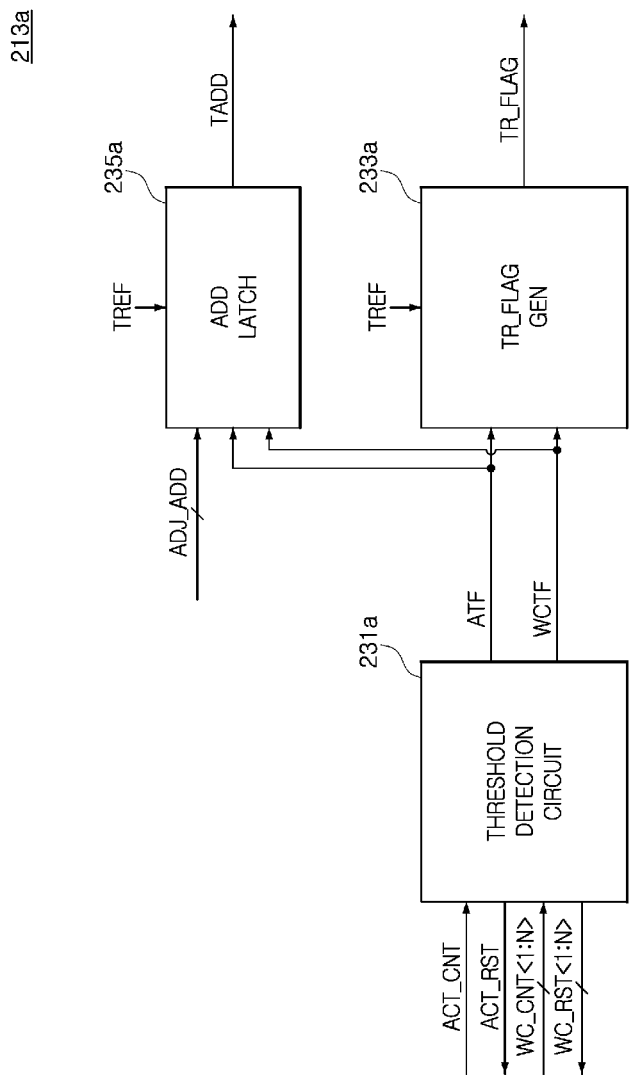
FIG. 4 is a block diagram illustrating a configuration according to an example of a target refresh control circuit illustrated in FIG. 2.

FIG. 4 is a block diagram illustrating a configuration according to an example of the target refresh control circuit 213a illustrated in FIG. 2. As illustrated in FIG. 4, the target refresh control circuit 213a may include a threshold detection circuit 231a, a target refresh flag generation circuit (TR_FLAG GEN) 233a, and an address latch circuit (ADD LATCH) 235a.

The threshold detection circuit 231a may generate a weak cell threshold flag WCTF and the first to N-th weak cell count reset signals WC_RST<1:N> based on the first to N-th weak cell count signals WC_CNT<1:N>. When at least one of the first to N-th weak cell count signals WC_CNT<1:N> has a first threshold value, the threshold detection circuit 231a may activate the weak cell threshold flag WCTF. The threshold detection circuit 231a may activate the first to N-th weak cell count reset signals WC_RST<1:N> corresponding to the first to N-th weak cell count signals WC_CNT<1:N> each having the first threshold value, respectively. The threshold detection circuit 231a may generate an active threshold flag ATF and the active count reset signal ACT_RST based on the active count signal ACT_CNT. The threshold detection circuit 231a may activate the active threshold flag ATF and the active count reset signal ACT_RST when the active count signal ACT_CNT has a second threshold value.

The target refresh flag generation circuit 233a may generate the target refresh flag TR_FLAG, based on the active threshold flag ATF, the weak cell threshold flag WCTF, and the target refresh signal TREF. When one of the active threshold flag ATF and the weak cell threshold flag WCTF is activated, the target refresh flag generation circuit 233a may activate the target refresh flag TR_FLAG. When the target refresh signal TREF is received by the preset number of times in the state in which the target refresh flag TR_FLAG has been activated, the target refresh flag generation circuit 233a may deactivate an activated target refresh flag TR_FLAG. For example, when the target refresh signal TREF is received twice in the state in which the target refresh flag TR_FLAG has been activated, the target refresh flag generation circuit 233a may deactivate an activated target refresh flag TR_FLAG.

The address latch circuit 235a may latch the adjacent address ADJ_ADD based on the active threshold flag ATF and the weak cell threshold flag WCTF, and may output the latched adjacent address ADJ_ADD as the target address TADD based on the target refresh signal TREF. The address latch circuit 235a may include multiple latch circuits. When one of the active threshold flag ATF and the weak cell threshold flag WCTF is activated, the address latch circuit 235a may latch the first adjacent address ADJ_ADD<1> and the second adjacent address ADJ_ADD<2> in a latch circuit. The address latch circuit 235a may output at least one of latched adjacent addresses ADJ_ADD as the target address TADD whenever the target refresh signal TREF is activated.

Figure 5:
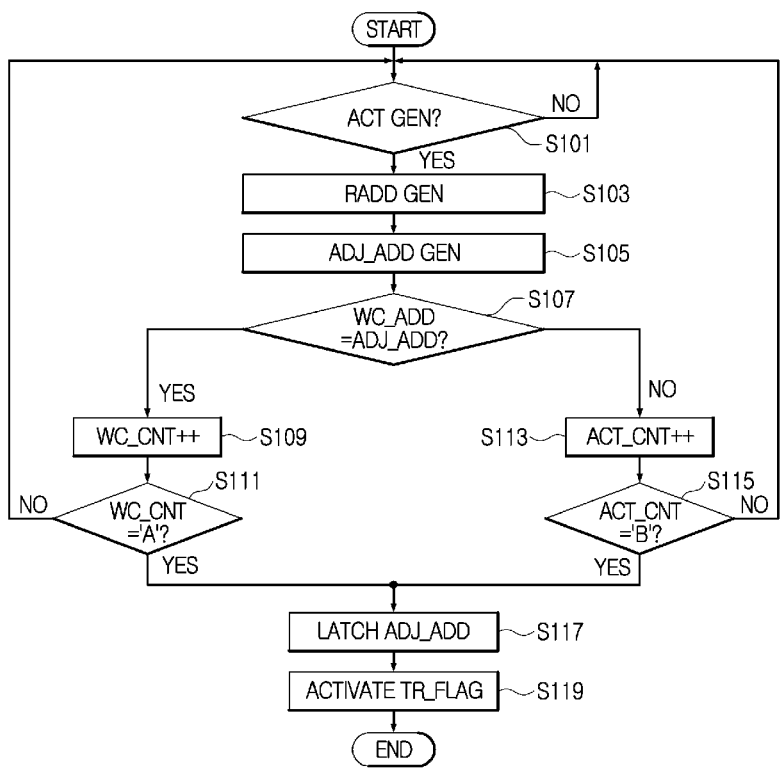
FIG. 5 is a flowchart for describing an active operation performed by the electronic device illustrated in FIG. 2.

FIG. 5 is a flowchart for describing an active operation performed by the electronic device 120a illustrated in FIG. 2.

At S101, the command decoder 201a may generate the active signal ACT whenever the command CMD for performing an active operation is received.

At S103, the address decoder 203a may generate the row address RADD by decoding the address ADD when an active operation is performed.

At S105, the adjacent address generation circuit 205a may generate the first adjacent address ADJ_ADD<1> by subtracting "1" from a value of the row address RADD, and may generate the second adjacent address ADJ_ADD<2> by adding "1" to the value of the row address RADD.

At S107, the count signal generation circuit 211a may determine whether a value of the weak cell address WC_ADD is identical with one of the values of the first adjacent address ADJ_ADD<1> and the second adjacent address ADJ_ADD<2>.

When the determination result of S107 indicates that the value of the weak cell address WC_ADD is identical with one of the values of the first adjacent address ADJ_ADD<1> and the second adjacent address ADJ_ADD<2>, at S109, the count signal generation circuit 211a may increase the value of the weak cell count signal WC_CNT by "1."

At S111, the target refresh control circuit 213a may determine whether the weak cell count signal WC_CNT has a first threshold value "A." When the determination result of S111 indicates that a value of the weak cell count signal WC_CNT is smaller than the first threshold value "A," the electronic device 120a may repeatedly perform S101, S103, S105, S107, S109, and S111.

When the determination result of S107 indicates that the value of the weak cell address WC_ADD is different from each of the values of the first adjacent address ADJ_ADD<1> and the second adjacent address ADJ_ADD<2>, at S113, the count signal generation circuit 211a may increase the value of the active count signal ACT_CNT by "1."

At S115, the target refresh control circuit 213a may determine whether the active count signal ACT_CNT has a second threshold value "B." When the determination result of S115 indicates that a value of the active count signal ACT_CNT is smaller than the second threshold value "B," the electronic device 120a may repeatedly perform S101, S103, S105, S107, S113, and S115.

When the determination result of S111 indicates that the weak cell count signal WC_CNT has the first threshold value "A" or the determination result of S115 indicates that the active count signal ACT_CNT has the second threshold value "B," at S117, the target refresh control circuit 213a may latch the first adjacent address ADJ_ADD<1> and the second adjacent address ADJ_ADD<2>. When the determination result of S111 indicates that the weak cell count signal WC_CNT has the first threshold value "A," the target refresh control circuit 213a may reset the value of the weak cell count signal WC_CNT based on the weak cell count reset signal WC_RST. When the determination result of S115 indicates that the active count signal ACT_CNT has the second threshold value "B," the target refresh control circuit 213a may reset the value of the active count signal ACT_CNT based on the active count reset signal ACT_RST.

At S119, the target refresh control circuit 213a may activate the target refresh flag TR_FLAG in order to generate the target refresh signal TREF for performing a refresh operation on the target address TADD.

Figure 6:
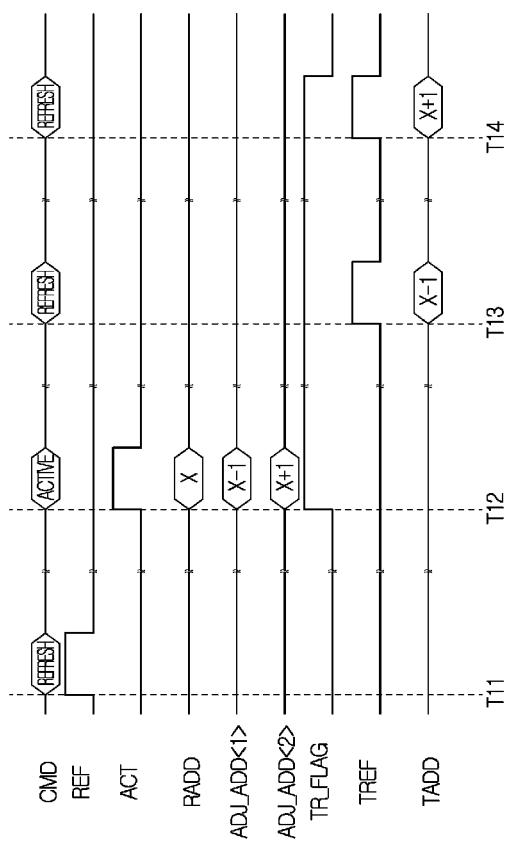
FIG. 6 is a timing diagram for describing a refresh operation for a target address, which is performed by the electronic device illustrated in FIG. 2.

FIG. 6 is a timing diagram for describing a refresh operation for a target address TADD, which is performed by the electronic device 120a illustrated in FIG. 2.

At T11, the command decoder 201a may activate the refresh signal REF by decoding the command CMD for a refresh operation based on a deactivated target refresh flag TR_FLAG. When the refresh signal REF is activated, the row control circuit 215a may perform a refresh operation on a memory cell coupled to a word line WL.

At T12, the command decoder 201a may activate the active signal ACT by decoding the command CMD for an active operation. When an active operation is performed, the address decoder 203a may generate the row address RADD having a value "X" by decoding the address ADD. When the active signal ACT is activated, the row control circuit 215a may perform an active operation of activating an X-th word line WL<X> corresponding to the value of the row address RADD.

At T12, when the active operation is performed, the adjacent address generation circuit 205a may generate the first adjacent address ADJ_ADD<1> having a value "X−1" and the second adjacent address ADJ_ADD<2> having a value "X+1" from the row address RADD having the value "X." The count signal generation circuit 211a may increase one of the values of the weak cell count signal WC_CNT and the active count signal ACT_CNT by comparing the weak cell address WC_ADD with the first adjacent address ADJ_ADD<1> and the second adjacent address ADJ_ADD<2>. When the weak cell count signal WC_CNT has a first threshold value or the active count signal ACT_CNT has a second threshold value, the target refresh control circuit 213a may latch the first adjacent address ADJ_ADD<1> and the second adjacent address ADJ_ADD<2>, and may activate the target refresh flag TR_FLAG.

At T13, the command decoder 201a may activate the target refresh signal TREF for performing a refresh operation on the target address TADD by decoding the command CMD for a refresh operation, based on the activated target refresh flag TR_FLAG. When the target refresh signal TREF is activated, the target refresh control circuit 213a may generate the target address TADD having the value "X−1" by outputting the latched first adjacent address ADJ_ADD<1>. When the target refresh signal TREF is activated, the row control circuit 215a may perform a refresh operation on a memory cell coupled to an (X−1)-th word line WL<X−1> corresponding to the value of the target address TADD.

At T14, the command decoder 201a may activate the target refresh signal TREF by decoding the command CMD for a refresh operation, based on the activated target refresh flag TR_FLAG. When the target refresh signal TREF is activated, the target refresh control circuit 213a may generate the target address TADD having the value "X+1" by outputting the latched second adjacent address ADJ_ADD<2>. When the target refresh signal TREF is activated, the row control circuit 215a may perform a refresh operation on a memory cell coupled to an (X+1)-th word line WL<X+1> corresponding to the value of the target address TADD. The target refresh control circuit 213a may deactivate the activated target refresh flag TR_FLAG based on the target refresh signal TREF.

Figure 7:
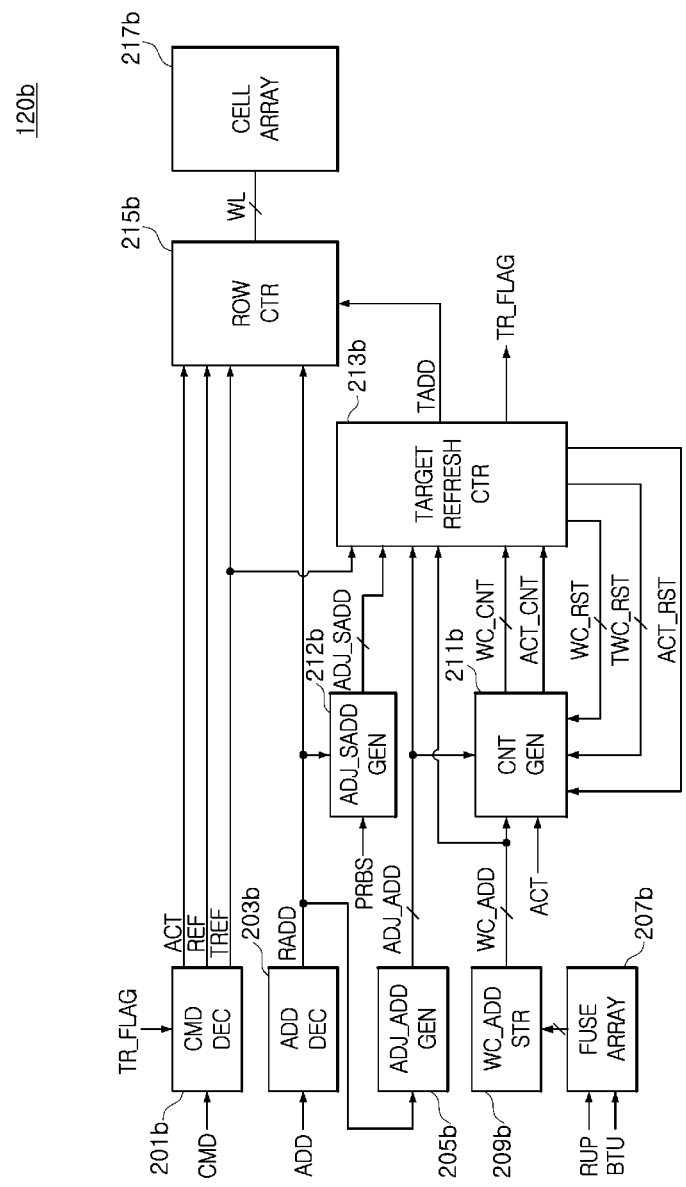
FIG. 7 is a block diagram illustrating a configuration according to another example of the electronic device illustrated in FIG. 1.

FIG. 7 is a block diagram illustrating a configuration according to another example of the electronic device 120 illustrated in FIG. 1. As illustrated in FIG. 7, an electronic device 120b may include a command decoder (CMD DEC) 201b, an address decoder (ADD DEC) 203b, an adjacent address generation circuit (ADJ_ADD GEN) 205*b*, a fuse array 207*b*, a weak cell address storage circuit (WC_ADD STR) 209*b*, a count signal generation circuit (CNT GEN) 211*b*, an adjacent sampling address generation circuit (ADJ_SADD GEN) 212*b*, a target refresh control circuit (TARGET REFRESH CTR) 213*b*, a row control circuit (ROW CTR) 215*b*, and a cell array 217*b*. The command decoder 201*b*, the address decoder 203*b*, the adjacent address generation circuit 205*b*, the fuse array 207*b*, the weak cell address storage circuit 209*b*, the row control circuit 215*b*, and the cell array 217*b* are implemented identically with the command decoder 201*a*, the address decoder 203*a*, the adjacent address generation circuit 205*a*, the fuse array 207*a*, the weak cell address storage circuit 209*a*, the row control circuit 215*a*, and the cell array 217*a* illustrated in FIG. 2, respectively, and thus detailed descriptions thereof are omitted here.

The count signal generation circuit 211*b* may generate the weak cell count signal WC_CNT and the active count signal ACT_CNT by comparing the weak cell address WC_ADD with the adjacent address ADJ_ADD, based on the active signal ACT, the weak cell count reset signal WC_RST, a target count reset signal TWC_RST, and the active count reset signal ACT_RST. The weak cell count reset signal WC_RST and the target count reset signal TWC_RST may be activated in order to reset each of the values of the first to N-th weak cell count signals WC_CNT<1:N>. The active count reset signal ACT_RST may be activated in order to reset a value of the active count signal ACT_CNT. An operating method of generating, by the count signal generation circuit 211*b*, the weak cell count signal WC_CNT and the active count signal ACT_CNT by comparing the weak cell address WC_ADD with the adjacent address ADJ_ADD when an active operation is performed is implemented identically with that of the count signal generation circuit 211*a* illustrated in FIG. 2. A configuration and operation of the count signal generation circuit 211*b* are described later with reference to FIG. 8.

The adjacent sampling address generation circuit 212*b* may generate an adjacent sampling address ADJ_SADD from the row address RADD based on a randomly activated random signal PRBS. The random signal PRBS may be randomly activated to a first logic level or may be deactivated to a second logic level. The adjacent sampling address ADJ_SADD may include a first adjacent sampling address ADJ_SADD<1> and a second adjacent sampling address ADJ_SADD<2>. The adjacent sampling address generation circuit 212*b* may generate a sampling address (not illustrated) by sampling the row address RADD whenever the random signal PRBS is activated. The adjacent sampling address generation circuit 212*b* may generate the first adjacent sampling address ADJ_SADD<1> by subtracting "1" from a value of the sampling address, and may generate the second adjacent sampling address ADJ_SADD<2> by adding "1" to the value of the sampling address. For example, when the sampling address has a value "X'," the adjacent sampling address generation circuit 212*b* may generate the first adjacent sampling address ADJ_SADD<1> having a value "X'–1" by subtracting "1" from the value "X'," and may generate the second adjacent sampling address ADJ_SADD<2> having a value "X'+1" by adding "1" to the value "X'."

The target refresh control circuit 213*b* may generate the target address TADD, the target refresh flag TR_FLAG, the weak cell count reset signal WC_RST, the target count reset signal TWC_RST, and the active count reset signal ACT_RST, based on the weak cell count signal WC_CNT, the active count signal ACT_CNT, the target refresh signal TREF, the weak cell address WC_ADD, the adjacent address ADJ_ADD, and the adjacent sampling address ADJ_SADD. The target count reset signal TWC_RST may include first to N-th target count reset signals TWC_RST<1:N> activated in order to reset values of the first to N-th weak cell count signals WC_CNT<1:N>, respectively.

The target refresh control circuit 213*b* may latch the adjacent address ADJ_ADD based on the weak cell count signal WC_CNT, and may latch the adjacent sampling address ADJ_SADD based on the active count signal ACT_CNT. The target refresh control circuit 213*b* may output the latched adjacent address ADJ_ADD or the latched adjacent sampling address ADJ_SADD as the target address TADD based on the target refresh signal TREF.

The target refresh control circuit 213*b* may latch the adjacent address ADJ_ADD based on a value of the weak cell count signal WC_CNT. When at least one of the first to N-th weak cell count signals WC_CNT<1:N> has a first threshold value, the target refresh control circuit 213*b* may latch the adjacent address ADJ_ADD.

The target refresh control circuit 213*b* may latch the adjacent sampling address ADJ_SADD based on a value of the active count signal ACT_CNT. When the active count signal ACT_CNT has a second threshold value, the target refresh control circuit 213*b* may latch the adjacent sampling address ADJ_SADD. When the active count signal ACT_CNT has the second threshold value, if a value of the weak cell address WC_ADD is identical with a value of the adjacent sampling address ADJ_SADD, the target refresh control circuit 213*b* may activate the target count reset signal TWC_RST. More specifically, when the active count signal ACT_CNT has the second threshold value, the target refresh control circuit 213*b* may activate the first to N-th target count reset signals TWC_RST<1:N> corresponding to the first to N-th weak cell addresses WC_ADD<1:N> having the same value as the adjacent sampling address ADJ_SADD. Accordingly, when the adjacent sampling address ADJ_SADD having the same value as the weak cell address WC_ADD is latched, the target refresh control circuit 213*b* may reset a value of the weak cell count signal WC_CNT corresponding to the weak cell address WC_ADD based on the target count reset signal TWC_RST, thereby reducing the number of times that a refresh operation is unnecessarily performed in order to reduce a row hammer phenomenon for a weak cell.

The target refresh control circuit 213*b* may generate the target refresh flag TR_FLAG, based on the weak cell count signal WC_CNT, the active count signal ACT_CNT, and the target refresh signal TREF. When the weak cell count signal WC_CNT has a first threshold value or the active count signal ACT_CNT has a second threshold value, the target refresh control circuit 213*b* may activate the target refresh flag TR_FLAG. The target refresh control circuit 213*b* may deactivate the activated target refresh flag TR_FLAG based on the target refresh signal TREF.

The target refresh control circuit 213*b* may activate the first to N-th weak cell count reset signals WC_RST<1:N> corresponding to the first to N-th weak cell count signals WC_CNT<1:N> each having the first threshold value, respectively. When the active count signal ACT_CNT has the second threshold value, the target refresh control circuit 213*b* may activate the active count reset signal ACT_RST. A configuration and operation of the target refresh control circuit 213*b* are specifically described later with reference to FIG. 9.

Figure 8:
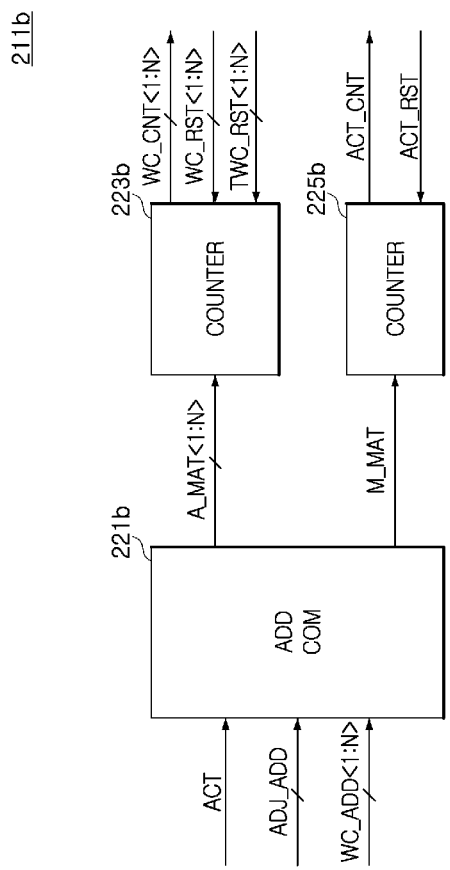
FIG. 8 is a block diagram illustrating a configuration according to an example of a count signal generation circuit illustrated in FIG. 7.

FIG. 8 is a block diagram illustrating a configuration according to an example of the count signal generation circuit 211b illustrated in FIG. 7. As illustrated in FIG. 8, the count signal generation circuit 211b may include an address comparison circuit (ADD COM) 221b, a first counter 223b, and a second counter 225b. The address comparison circuit 221b and the second counter 225b are implemented identically with the address comparison circuit 221a and the second counter 225a illustrated in FIG. 3, respectively, and thus detailed descriptions thereof are omitted here.

The first counter 223b may increase each of the values of the first to N-th weak cell count signals WC_CNT<1:N> by counting the input of each of the first to N-th address match signals A_MAT<1:N>. The first counter 223b may reset values of the first to N-th weak cell count signals WC_CNT<1:N> corresponding to the first to N-th weak cell count reset signals WC_RST<1:N>, respectively. Furthermore, the first counter 223b may reset values of the first to N-th weak cell count signals WC_CNT<1:N> corresponding to the first to N-th target count reset signals TWC_RST<1:N>, respectively.

Figure 9:
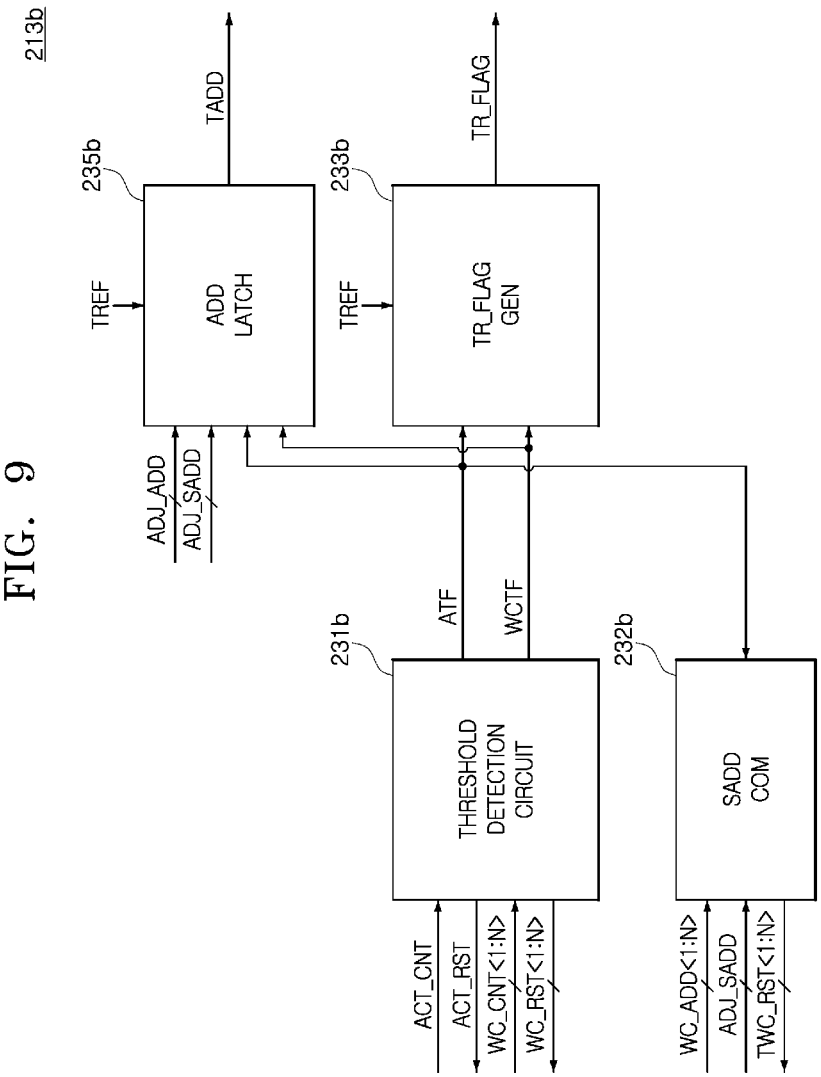
FIG. 9 is a block diagram illustrating a configuration according to an example of a target refresh control circuit illustrated in FIG. 7.

FIG. 9 is a block diagram illustrating a configuration according to an example of the target refresh control circuit 213b illustrated in FIG. 7. As illustrated in FIG. 9, the target refresh control circuit 213b may include a threshold detection circuit 231b, a sampling address comparison circuit (SADD COM) 232b, a target refresh flag generation circuit (TR_FLAG GEN) 233b, and an address latch circuit (ADD LATCH) 235b.

The threshold detection circuit 231b may generate the weak cell threshold flag WCTF and the first to N-th weak cell count reset signals WC_RST<1:N> based on the first to N-th weak cell count signals WC_CNT<1:N>. The threshold detection circuit 231b may generate the active threshold flag ATF and the active count reset signal ACT_RST based on the active count signal ACT_CNT. An operating method of the threshold detection circuit 231b is implemented identically with that of the threshold detection circuit 231a illustrated in FIG. 4.

The sampling address comparison circuit 232b may generate each of the first to N-th target count reset signals TWC_RST<1:N> by comparing the adjacent sampling address ADJ_SADD with each of the first to N-th weak cell addresses WC_ADD<1:N> based on the active threshold flag ATF. More specifically, when the active threshold flag ATF is activated, the sampling address comparison circuit 232b may activate the first to N-th target count reset signals TWC_RST<1:N> corresponding to the first to N-th weak cell addresses WC_ADD<1:N> having the same value as the adjacent sampling address ADJ_SADD.

The target refresh flag generation circuit 233b may generate the target refresh flag TR_FLAG, based on the active threshold flag ATF, the weak cell threshold flag WCTF, and the target refresh signal TREF. An operating method of the target refresh flag generation circuit 233b is implemented identically with that of the target refresh flag generation circuit 233a illustrated in FIG. 4.

The address latch circuit 235b may latch the adjacent address ADJ_ADD based on the weak cell threshold flag WCTF, and may latch the adjacent sampling address ADJ_SADD based on the active threshold flag ATF. The address latch circuit 235b may output the latched adjacent address ADJ_ADD or the latched adjacent sampling address ADJ_SADD as the target address TADD based on the target refresh signal TREF. The address latch circuit 235b may include multiple latch circuits. When the weak cell threshold flag WCTF is activated, the address latch circuit 235b may latch the first adjacent address ADJ_ADD<1> and the second adjacent address ADJ_ADD<2> in a latch circuit. When the active threshold flag ATF is activated, the address latch circuit 235b may latch the first adjacent sampling address ADJ_SADD<1> and the second adjacent sampling address ADJ_SADD<2> in a latch circuit. The address latch circuit 235b may output at least one of the latched adjacent address ADJ_ADD and the latched adjacent sampling address ADJ_SADD as the target address TADD whenever the target refresh signal TREF is activated.

Figure 10:
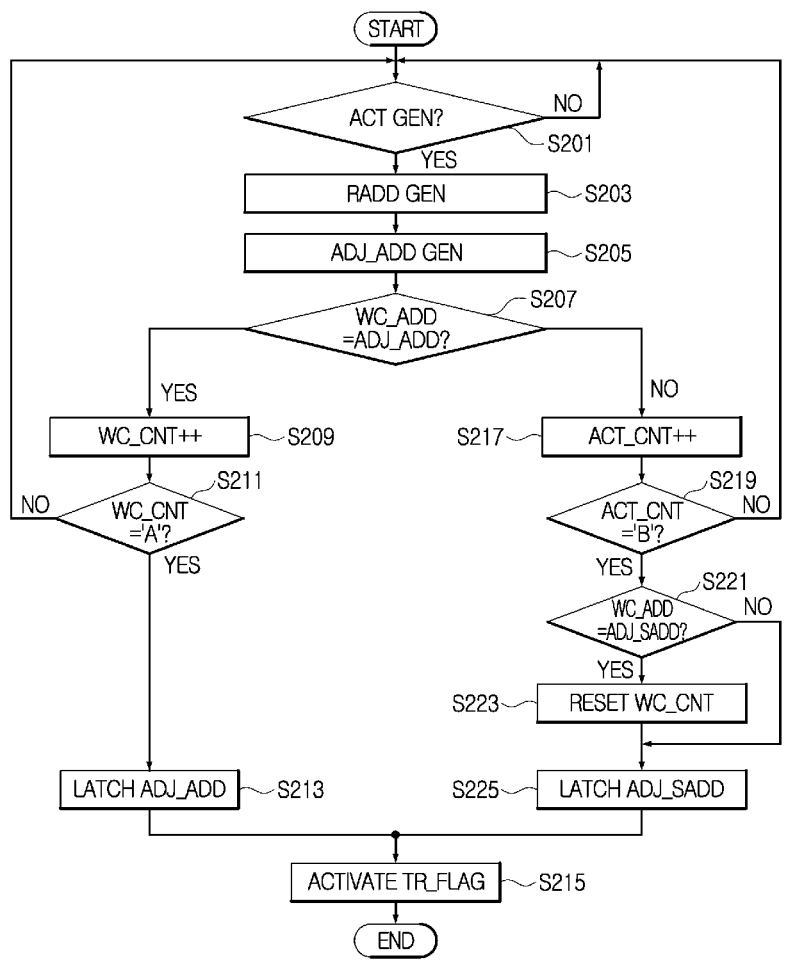
FIG. 10 is a flowchart for describing an active operation performed by the electronic device illustrated in FIG. 7.

FIG. 10 is a flowchart for describing an active operation performed by the electronic device 120b illustrated in FIG. 7.

At S201, the command decoder 201b may generate the active signal ACT whenever the command CMD for performing an active operation is received.

At S203, when an active operation is performed, the address decoder 203b may generate the row address RADD by decoding the address ADD.

At S205, the adjacent address generation circuit 205b may generate the first adjacent address ADJ_ADD<1> by subtracting "1" from a value of the row address RADD, and may generate the second adjacent address ADJ_ADD<2> by adding "1" to the value of the row address RADD.

At S207, the count signal generation circuit 211b may determine whether a value of the weak cell address WC_ADD is identical with one of the values of the first adjacent address ADJ_ADD<1> and the second adjacent address ADJ_ADD<2>.

When the determination result of S207 indicates that the value of the weak cell address WC_ADD is identical with one of the values of the first adjacent address ADJ_ADD<1> and the second adjacent address ADJ_ADD<2>, at S209, the count signal generation circuit 211b may increase a value of the weak cell count signal WC_CNT by "1."

At S211, the target refresh control circuit 213b may determine whether the weak cell count signal WC_CNT has a first threshold value "A." When the determination result of S211 indicates that a value of the weak cell count signal WC_CNT is smaller than the first threshold value "A," the electronic device 120b may repeatedly perform S201, S203, S205, S207, S209, and S211.

When the determination result of S211 indicates that the weak cell count signal WC_CNT has the first threshold value "A," the target refresh control circuit 213b may latch the first adjacent address ADJ_ADD<1> and the second adjacent address ADJ_ADD<2> at S213, and may activate the target refresh flag TR_FLAG at S215. When the determination result of S211 indicates that the weak cell count signal WC_CNT has the first threshold value "A," the target refresh control circuit 213b may reset the value of the weak cell count signal WC_CNT based on the weak cell count reset signal WC_RST.

When the determination result of S207 indicates that the value of the weak cell address WC_ADD is different from each of the values of the first adjacent address ADJ_ADD<1> and the second adjacent address ADJ_ADD<2>, at S217, the count signal generation circuit 211b may increase a value of the active count signal ACT_CNT by "1."

At S219, the target refresh control circuit 213b may determine whether the active count signal ACT_CNT has a second threshold value "B." When the determination result of S219 indicates that a value of the active count signal ACT_CNT is smaller than the second threshold value "B," the electronic device 120b may repeatedly perform S201, S203, S205, S207, S217, and S219.

When the determination result of S219 indicates that the active count signal ACT_CNT has the second threshold value "B," at S221, the target refresh control circuit 213b may determine whether the value of the weak cell address WC_ADD is identical with one of the values of the first adjacent sampling address ADJ_SADD<1> and the second adjacent sampling address ADJ_SADD<2>. When the determination result of S219 indicates that the active count signal ACT_CNT has the second threshold value "B," the target refresh control circuit 213b may reset the value of the active count signal ACT_CNT based on the active count reset signal ACT_RST.

When the determination result of S221 indicates that the value of the weak cell address WC_ADD is different from each of the values of the first adjacent sampling address ADJ_SADD<1> and the second adjacent sampling address ADJ_SADD<2>, the target refresh control circuit 213b may perform S225.

When the determination result of S221 indicates that the value of the weak cell address WC_ADD is identical with one of the values of the first adjacent sampling address ADJ_SADD<1> and the second adjacent sampling address ADJ_SADD<2>, at S223, the target refresh control circuit 213b may reset the value of the weak cell count signal WC_CNT based on the target count reset signal TWC_RST. Thereafter, the target refresh control circuit 213b may perform S225.

The target refresh control circuit 213b may latch the first adjacent sampling address ADJ_SADD<1> and the second adjacent sampling address ADJ_SADD<2> at S225, and may activate the target refresh flag TR_FLAG at S215.

Figure 11:
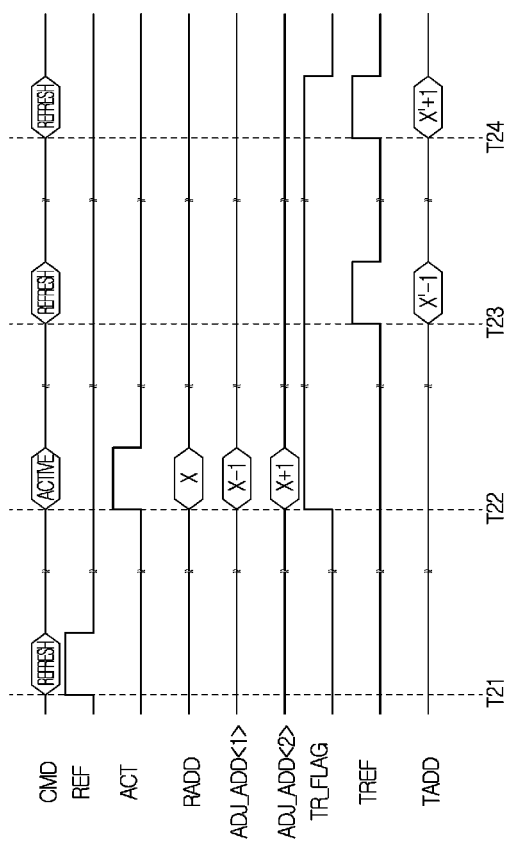
FIG. 11 is a timing diagram for describing a refresh operation for a target address, which is performed by the electronic device illustrated in FIG. 7.

FIG. 11 is a timing diagram for describing a refresh operation for the target address TADD generated from the adjacent sampling address ADJ_SADD, which is performed by the electronic device 120b illustrated in FIG. 7.

At T21, the command decoder 201b may activate the refresh signal REF by decoding the command CMD for a refresh operation based on a deactivated target refresh flag TR_FLAG. When the refresh signal REF is activated, the row control circuit 215b may perform a refresh operation on a memory cell coupled to a word line WL.

At T22, the command decoder 201b may activate the active signal ACT by decoding the command CMD for an active operation. When an active operation is performed, the address decoder 203b may generate the row address RADD having a value "X" by decoding the address ADD. When the active signal ACT is activated, the row control circuit 215b may perform an active operation of activating an X-th word line WL<X> corresponding to the value of the row address RADD.

At T22, when the active operation is performed, the adjacent address generation circuit 205b may generate the first adjacent address ADJ_ADD<1> having a value "X−1" and the second adjacent address ADJ_ADD<2> having a value "X+1" from the row address RADD having the value "X." When a value of the weak cell address WC_ADD is different from each of the values of the first adjacent address ADJ_ADD<1> and the second adjacent address ADJ_ADD<2>, the count signal generation circuit 211b may increase a value of the active count signal ACT_CNT. When the active count signal ACT_CNT has a second threshold value, the target refresh control circuit 213b may latch the first adjacent sampling address ADJ_SADD<1> having a value "X'−1" and the second adjacent sampling address ADJ_SADD<2> having a value "X'+1," and may activate the target refresh flag TR_FLAG.

At T23, the command decoder 201b may activate the target refresh signal TREF for performing a refresh operation on the target address TADD by decoding the command CMD for a refresh operation, based on the activated target refresh flag TR_FLAG. When the target refresh signal TREF is activated, the target refresh control circuit 213b may generate the target address TADD having the value "X'−1" by outputting the latched first adjacent sampling address ADJ_SADD<1>. When the target refresh signal TREF is activated, the row control circuit 215b may perform a refresh operation on a memory cell coupled to an (X'−1)-th word line WL<X'−1> corresponding to the value of the target address TADD.

At T24, the command decoder 201b may activate the target refresh signal TREF by decoding the command CMD for a refresh operation, based on the activated target refresh flag TR_FLAG. When the target refresh signal TREF is activated, the target refresh control circuit 213b may generate the target address TADD having the value "X'+1" by outputting the latched second adjacent sampling address ADJ_SADD<2>. When the target refresh signal TREF is activated, the row control circuit 215b may perform a refresh operation on a memory cell coupled to an (X'+1)-th word line WL<X'+1> corresponding to the value of the target address TADD. The target refresh control circuit 213b may deactivate the activated target refresh flag TR_FLAG based on the target refresh signal TREF.

Figure 12:
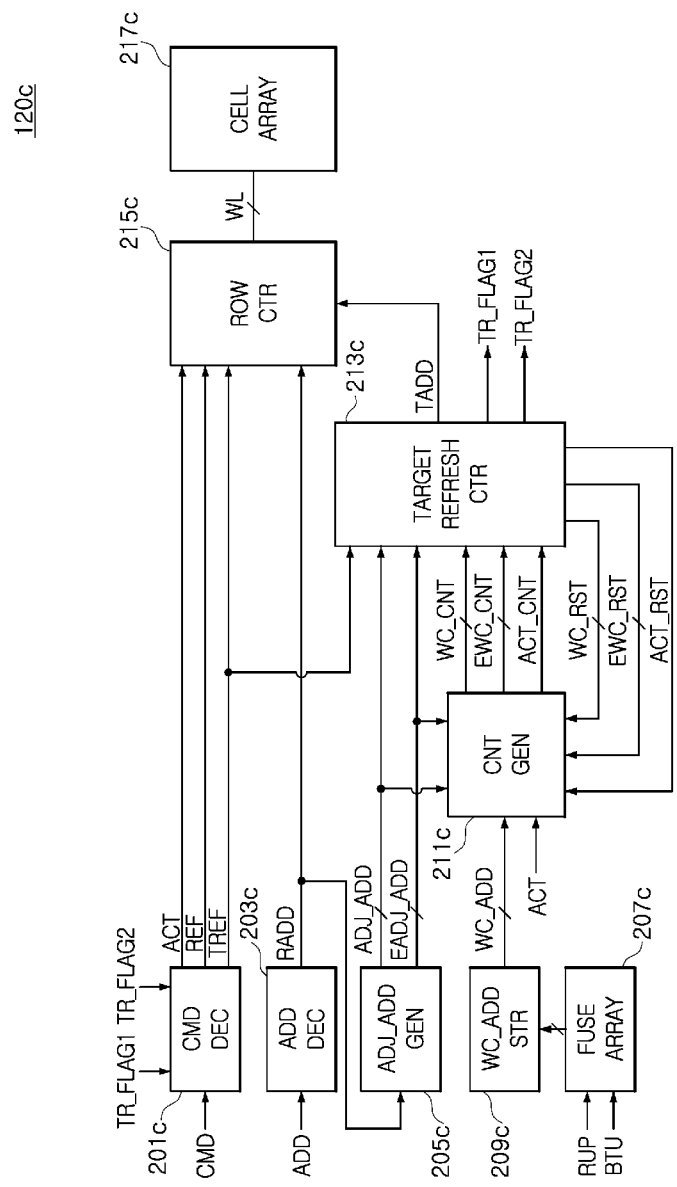
FIG. 12 is a block diagram illustrating a configuration according to still another example of the electronic device illustrated in FIG. 1.

FIG. 12 is a block diagram illustrating a configuration according to still another example of the electronic device 120 illustrated in FIG. 1. As illustrated in FIG. 12, an electronic device 120c may include a command decoder (CMD DEC) 201c, an address decoder (ADD DEC) 203c, an adjacent address generation circuit (ADJ_ADD GEN) 205c, a fuse array 207c, a weak cell address storage circuit (WC_ADD STR) 209c, a count signal generation circuit (CNT GEN) 211c, a target refresh control circuit (TARGET REFRESH CTR) 213c, a row control circuit (ROW CTR) 215c, and a cell array 217c. The address decoder 203c, the fuse array 207c, the weak cell address storage circuit 209c, the row control circuit 215c, and the cell array 217c are implemented identically with the address decoder 203a, the fuse array 207a, the weak cell address storage circuit 209a, the row control circuit 215a, and the cell array 217a illustrated in FIG. 2, respectively, and thus detailed descriptions thereof are omitted here.

The command decoder 201c may generate the active signal ACT for performing an active operation, the refresh signal REF for performing a refresh operation, and the target refresh signal TREF for performing a refresh operation on the target address TADD, by decoding the command CMD based on first and second target refresh flags TR_FLAG1 and TR_FLAG2. The command decoder 201c may activate the active signal ACT by decoding the command CMD for performing an active operation. When both the first and second target refresh flags TR_FLAG1 and TR_FLAG2 are deactivated, the command decoder 201c may activate the refresh signal REF by decoding the command CMD for performing a refresh operation. The command decoder 201c may activate the target refresh signal TREF by decoding the command CMD for performing a refresh operation in an interval of time during which at least one of the first and second target refresh flags TR_FLAG1 and TR_FLAG2 is activated.

The adjacent address generation circuit 205c may generate the adjacent address ADJ_ADD and an extension adjacent address EADJ_ADD based on the row address RADD. The adjacent address ADJ_ADD may include the first adjacent address ADJ_ADD<1> and the second adjacent address ADJ_ADD<2>. The extension adjacent address EADJ_ADD may include a first extension adjacent address EADJ_ADD<1> and a second extension adjacent address EADJ_ADD<2>. The adjacent address generation circuit 205c may generate the first adjacent address ADJ_ADD<1> by subtracting "1" from a value of the row address RADD, and may generate the second adjacent address ADJ_ADD<2> by adding "1" to the value of the row address RADD.

The adjacent address generation circuit 205c may generate the first extension adjacent address EADJ_ADD<1> by subtracting "2" from a value of the row address RADD, and may generate the second extension adjacent address EADJ_ADD<2> by adding "2" to the value of the row address RADD. For example, when the row address RADD has a value "X," the adjacent address generation circuit 205c may generate the first extension adjacent address EADJ_ADD<1> having a value "X-2" by subtracting "2" from the value "X," and may generate the second extension adjacent address EADJ_ADD<2> having a value "X+2" by adding "2" to the value "X." That is, the first extension adjacent address EADJ_ADD<1> may correspond to an (X-2)-th word line WL<X-2> adjacent to an (X-1)-th word line WL<X-1> corresponding to the first adjacent address ADJ_ADD<1>. Furthermore, the second extension adjacent address EADJ_ADD<2> may correspond to an (X+2)-th word line WL<X+2> adjacent to an (X+1)-th word line WL<X+1> corresponding to the second adjacent address ADJ_ADD<2>.

The count signal generation circuit 211c may generate the weak cell count signal WC_CNT, an extension weak cell count signal EWC_CNT, and the active count signal ACT_CNT by comparing the weak cell address WC_ADD with the adjacent address ADJ_ADD and the extension adjacent address EADJ_ADD, based on the active signal ACT, the weak cell count reset signal WC_RST, a weak cell extension count reset signal EWC_RST, and the active count reset signal ACT_RST. The weak cell count signal WC_CNT may include the first to N-th weak cell count signals WC_CNT<1:N> corresponding to the first to N-th weak cell addresses WC_ADD<1:N>, respectively. The weak cell extension count signal EWC_CNT may include first to N-th weak cell extension count signals EWC_CNT<1:N> corresponding to the first to N-th weak cell addresses WC_ADD<1:N>, respectively. The weak cell count reset signal WC_RST may include the first to N-th weak cell count reset signals WC_RST<1:N> activated in order to reset values of the first to N-th weak cell count signals WC_CNT<1:N>, respectively. The weak cell extension count reset signal EWC_RST may include first to N-th weak cell extension count reset signals EWC_RST<1:N> activated in order to reset values of the first to N-th weak cell extension count signals EWC_CNT<1:N>, respectively. The active count reset signal ACT_RST may be activated in order to reset a value of the active count signal ACT_CNT.

When an active operation is performed based on the active signal ACT, the count signal generation circuit 211c may increase one of the values of the weak cell count signal WC_CNT, the weak cell extension count signal WC_CNT, and the active count signal ACT_CNT based on a result of a comparison between the weak cell address WC_ADD and each of the adjacent address ADJ_ADD and the extension adjacent address EADJ_ADD.

When a value of the weak cell address WC_ADD is identical with a value of the adjacent address ADJ_ADD in an active operation, the count signal generation circuit 211c may increase a value of the weak cell count signal WC_CNT. For example, when a value of the first weak cell address WC_ADD<1> is identical with one of the values of the first adjacent address ADJ_ADD<1> and the second adjacent address ADJ_ADD<2> in an active operation, the count signal generation circuit 211c may increase a value of the first weak cell count signal WC_CNT<1>. For another example, when a value of the second weak cell address WC_ADD<2> is identical with one of the values of the first adjacent address ADJ_ADD<1> and the second adjacent address ADJ_ADD<2> in an active operation, the count signal generation circuit 211c may increase a value of the second weak cell count signal WC_CNT<2>. Accordingly, the count signal generation circuit 211c can closely monitor a row hammer phenomenon for a weak cell by counting the number of active operations executed for each weak cell address WC_ADD, whenever a word line to which a weak cell is coupled is adjacent to a word line activated upon active operation.

When a value of the weak cell address WC_ADD is identical with a value of the extension adjacent address EADJ_ADD in an active operation, the count signal generation circuit 211c may increase a value of the weak cell extension count signal EWC_CNT. For example, when a value of the first weak cell address WC_ADD<1> is identical with one of the values of the first extension adjacent address EADJ_ADD<1> and the second extension adjacent address EADJ_ADD<2> in an active operation, the count signal generation circuit 211c may increase a value of the first weak cell extension count signal EWC_CNT<1>. For another example, when a value of the second weak cell address WC_ADD<2> is identical with one of the values of the first extension adjacent address EADJ_ADD<1> and the second extension adjacent address EADJ_ADD<2> in an active operation, the count signal generation circuit 211c may increase a value of the second weak cell extension count signal EWC_CNT<2>. Accordingly, when a word line to which a weak cell is coupled is repeatedly activated, the count signal generation circuit 211c can also monitor a row hammer phenomenon for a memory cell coupled to a word line adjacent to the word line to which the weak cell is coupled.

When a value of the weak cell address WC_ADD is different from each of the values of the adjacent address ADJ_ADD and the extension adjacent address EADJ_ADD in an active operation, the count signal generation circuit 211c may increase a value of the active count signal ACT_CNT. For example, when values of the first weak cell address WC_ADD<1> and the second weak cell address WC_ADD<2> are different from values of the first adjacent address ADJ_ADD<1> and the second adjacent address ADJ_ADD<2>, and values of the first extension adjacent address EADJ_ADD<1> and the second extension adjacent address EADJ_ADD<2>, respectively, in an active operation, the count signal generation circuit 211c may increase a value of the active count signal ACT_CNT. Accordingly, the count signal generation circuit 211c can integratedly monitor a row hammer phenomenon for memory cells not determined as weak cells, by separately counting the number of active operations executed, whenever a word line to which a weak cell is coupled is not adjacent to a word line activated upon active operation. A configuration and operation of the count signal generation circuit 211c are specifically described later with reference to FIG. 13.

The target refresh control circuit 213c may generate the target address TADD, the first and second target refresh flags TR_FLAG1 and TR_FLAG2, the weak cell count reset signal WC_RST, the weak cell extension count reset signal WC_RST, and the active count reset signal ACT_RST, based on the weak cell count signal WC_CNT, the weak cell extension count signal EWC_CNT, the active count signal ACT_CNT, the target refresh signal TREF, the adjacent address ADJ_ADD, and the extension adjacent address EADJ_ADD.

The target refresh control circuit 213c may latch the adjacent address ADJ_ADD, based on the weak cell count signal WC_CNT and the active count signal ACT_CNT. The target refresh control circuit 213c may latch the adjacent address ADJ_ADD and the extension adjacent address EADJ_ADD based on the weak cell extension count signal EWC_CNT. The target refresh control circuit 213c may output the latched adjacent address ADJ_ADD or the latched extension adjacent address EADJ_ADD as the target address TADD based on the target refresh signal TREF. More specifically, when at least one of the first to N-th weak cell count signals WC_CNT<1:N> has a first threshold value or the active count signal ACT_CNT has a second threshold value, the target refresh control circuit 213c may latch the adjacent address ADJ_ADD. When at least one of the first to N-th weak cell extension count signals EWC_CNT<1:N> has a third threshold value, the target refresh control circuit 213c may latch the adjacent address ADJ_ADD and the extension adjacent address EADJ_ADD. The third threshold value may be set to be greater than the first threshold value.

The target refresh control circuit 213c may generate the first and second target refresh flags TR_FLAG1 and TR_FLAG2, based on the weak cell count signal WC_CNT, the weak cell extension count signal EWC_CNT, the active count signal ACT_CNT, and the target refresh signal TREF. More specifically, when at least one of the first to N-th weak cell count signals WC_CNT<1:N> has the first threshold value or the active count signal ACT_CNT has the second threshold value, the target refresh control circuit 213c may activate the first target refresh flag TR_FLAG1. When at least one of the first to N-th weak cell extension count signals EWC_CNT<1:N> has the third threshold value, the target refresh control circuit 213c may activate the second target refresh flag TR_FLAG2. The target refresh control circuit 213c may deactivate the activated first and second target refresh flags TR_FLAG1 and TR_FLAG2 based on the target refresh signal TREF.

The target refresh control circuit 213c may activate the first to N-th weak cell count reset signals WC_RST<1:N> corresponding to the first to N-th weak cell count signals WC_CNT having each the first threshold value. When the active count signal ACT_CNT has the second threshold value, the target refresh control circuit 213c may activate the active count reset signal ACT_RST. The target refresh control circuit 213c may activate the first to N-th weak cell extension count reset signals EWC_RST<1:N> corresponding to the first to N-th weak cell extension count signals EWC_CNT having each the third threshold value. A configuration and operation of the target refresh control circuit 213c are specifically described later with reference to FIG. 14.

Figure 13:
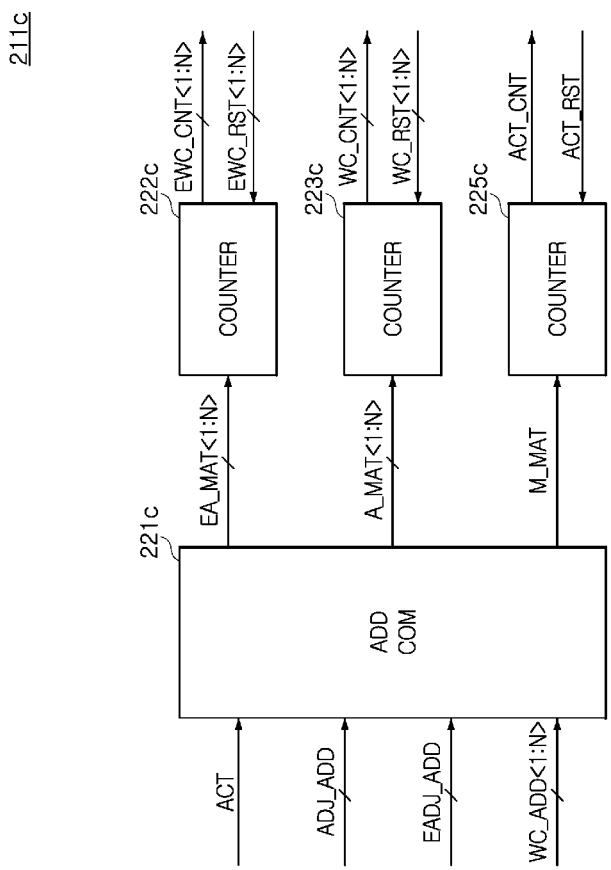
FIG. 13 is a block diagram illustrating a configuration according to an example of a count signal generation circuit illustrated in FIG. 12.

FIG. 13 is a block diagram illustrating a configuration according to an example of the count signal generation circuit 211c illustrated in FIG. 12. As illustrated in FIG. 13, the count signal generation circuit 211c may include an address comparison circuit (ADD COM) 221c, a first counter 222c, a second counter 223c, and a third counter 225c.

When an active operation is performed based on the active signal ACT, the address comparison circuit 221c may generate first to N-th extension address match signals EA_MAT<1:N>, the first to N-th address match signals A_MAT<1:N>, and the mismatch signal M_MAT by comparing the first to N-th weak cell addresses WC_ADD<1:N> with the adjacent address ADJ_ADD and the extension adjacent address EADJ_ADD.

When at least one of the values of the first to N-th weak cell addresses WC_ADD<1:N> is identical with a value of the extension adjacent address EADJ_ADD, the address comparison circuit 221c may activate at least one of the first to N-th extension address match signals EA_MAT<1:N>. For example, when a value of the first weak cell address WC_ADD<1> is identical with one of the values of the first extension adjacent address EADJ_ADD<1> and the second extension adjacent address EADJ_ADD<2>, the address comparison circuit 221c may activate the first extension address match signal EA_MAT<1>. For another example, when a value of the second weak cell address WC_ADD<2> is identical with one of the values of the first extension adjacent address EADJ_ADD<1> and the second extension adjacent address EADJ_ADD<2>, the address comparison circuit 221c may activate the second extension address match signal EA_MAT<2>.

When at least one of the values of the first to N-th weak cell addresses WC_ADD<1:N> is identical with a value of the adjacent address ADJ_ADD, the address comparison circuit 221c may activate at least one of the first to N-th address match signals A_MAT<1:N>. For example, when a value of the first weak cell address WC_ADD<1> is identical with one of the values of the first adjacent address ADJ_ADD<1> and the second adjacent address ADJ_ADD<2>, the address comparison circuit 221c may activate the first address match signal A_MAT<1>. For another example, when a value of the second weak cell address WC_ADD<2> is identical with one of the values of the first adjacent address ADJ_ADD<1> and the second adjacent address ADJ_ADD<2>, the address comparison circuit 221c may activate the second address match signal A_MAT<2>.

When each of the values of the first to N-th weak cell addresses WC_ADD<1:N> is different from each of the values of the adjacent address ADJ_ADD and the extension adjacent address EADJ_ADD, the address comparison circuit 221c may activate the mismatch signal M_MAT. For example, when each of the values of the first weak cell address WC_ADD<1> and the second weak cell address WC_ADD<2> is different from each of the values of the first adjacent address ADJ_ADD<1>, the second adjacent address ADJ_ADD<2>, the first extension adjacent address EADJ_ADD<1>, and the second extension adjacent address EADJ_ADD<2>, the address comparison circuit 221c may activate the mismatch signal M_MAT.

The first counter 222c may increase each of the values of the first to N-th weak cell extension count signals EWC_CNT<1:N> by counting the input of each of the first to N-th address extension match signals EA_MAT<1:N>. For example, the first counter 222c may increase a value of the first weak cell extension count signal EWC_CNT<1> by "1" whenever the first address extension match signal EA_MAT<1> is activated. For another example, the first counter 222c may increase a value of the second weak cell extension count signal EWC_CNT<2> by "1" whenever the second address extension match signal EA_MAT<2> is activated. The first counter 222c may reset values of the first to N-th weak cell extension count signals EWC_CNT<1:N> corresponding to the first to N-th weak cell extension count reset signals EWC_RST<1:N>.

The second counter 223c may generate the first to N-th weak cell count signals WC_CNT<1:N>, based on the first to N-th address match signals A_MAT<1:N> and the first to N-th weak cell count reset signals WC_RST<1:N>. An operating method of the second counter 223c is implemented identically with that of the first counter 223a illustrated in FIG. 3.

The third counter 225c may generate the active count signal ACT_CNT, based on the mismatch signal M_MAT and the active count reset signal ACT_RST. An operating method of the third counter 225c is implemented identically with that of the second counter 225a illustrated in FIG. 3.

Figure 14:
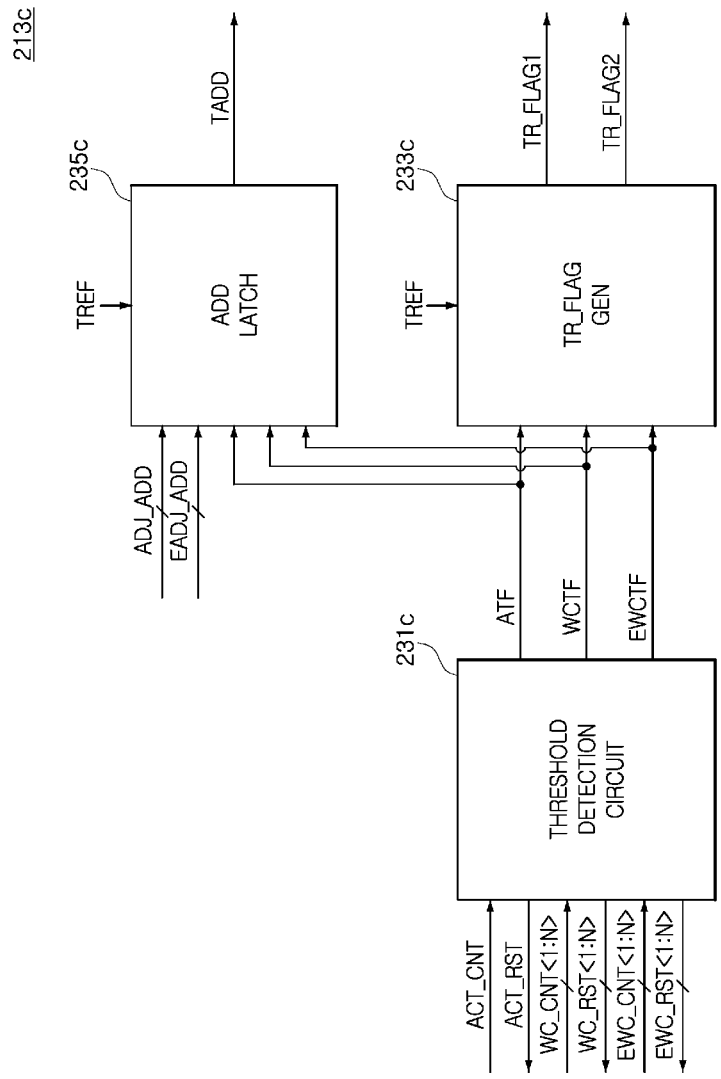
FIG. 14 is a block diagram illustrating a configuration according to an example of a target refresh control circuit illustrated in FIG. 12.

FIG. 14 is a block diagram illustrating a configuration according to an example of the target refresh control circuit 213c illustrated in FIG. 12. As illustrated in FIG. 14, the target refresh control circuit 213c may include a threshold detection circuit 231c, a target refresh flag generation circuit (TR_FLAG GEN) 233c, and an address latch circuit (ADD LATCH) 235c.

The threshold detection circuit 231c may generate the weak cell threshold flag WCTF and the first to N-th weak cell count reset signals WC_RST<1:N> based on the first to N-th weak cell count signals WC_CNT<1:N>. The threshold detection circuit 231c may generate the active threshold flag ATF and the active count reset signal ACT_RST based on the active count signal ACT_CNT. An operating method of generating, by the threshold detection circuit 231c, the weak cell threshold flag WCTF, the weak cell count reset signal WC_RST, the active threshold flag ATF, and the active count reset signal ACT_RST is implemented identically with that of the threshold detection circuit 231a illustrated in FIG. 4.

The threshold detection circuit 231c may generate a weak cell extension threshold flag EWCTF and the first to N-th weak cell extension count reset signals EWC_RST<1:N>, based on the first to N-th weak cell extension count signals EWC_CNT<1:N>. When at least one of the first to N-th weak cell extension count signals EWC_CNT<1:N> has a third threshold value, the threshold detection circuit 231c may activate the weak cell extension threshold flag EWCTF. The threshold detection circuit 231c may activate the first to N-th weak cell extension count reset signals EWC_RST<1:N> corresponding to the first to N-th weak cell extension count signals EWC_CNT<1:N> having the third threshold value.

The target refresh flag generation circuit 233c may generate the first target refresh flag TR_FLAG1 and the second target refresh flag TR_FLAG2, based on the active threshold flag ATF, the weak cell threshold flag WCTF, the weak cell extension threshold flag EWCTF, and the target refresh signal TREF. When one of the active threshold flag ATF and the weak cell threshold flag WCTF is activated, the target refresh flag generation circuit 233c may activate the first target refresh flag TR_FLAG1. When the target refresh signal TREF is received by the preset number of times in the state in which the first target refresh flag TR_FLAG1 has been activated, the target refresh flag generation circuit 233c may deactivate the activated first target refresh flag TR_FLAG1. For example, when the target refresh signal TREF is received twice in the state in which the first target refresh flag TR_FLAG1 has been activated, the target refresh flag generation circuit 233c may deactivate the activated first target refresh flag TR_FLAG1. When the weak cell extension threshold flag EWCTF is activated, the target refresh flag generation circuit 233c may activate the second target refresh flag TR_FLAG2. When the target refresh signal TREF is received by the preset number of times in the state in which the second target refresh flag TR_FLAG2 has been activated, the target refresh flag generation circuit 233c may deactivate the activated second target refresh flag TR_FLAG2. For example, when the target refresh signal TREF is received four times in the state in which the second target refresh flag TR_FLAG2 has been activated, the target refresh flag generation circuit 233c may deactivate the activated second target refresh flag TR_FLAG2.

The address latch circuit 235c may latch the adjacent address ADJ_ADD based on the active threshold flag ATF and the weak cell threshold flag WCTF. The address latch circuit 235c may latch the adjacent address ADJ_ADD and the extension adjacent address EADJ_ADD based on the weak cell extension threshold flag EWCTF. The address latch circuit 235c may output the latched adjacent address ADJ_ADD or the latched extension adjacent address EADJ_ADD as the target address TADD, based on the target refresh signal TREF. The address latch circuit 235c may include multiple latch circuits. When one of the active threshold flag ATF and the weak cell threshold flag WCTF is activated, the address latch circuit 235c may latch the first adjacent address ADJ_ADD<1> and the second adjacent address ADJ_ADD<2> in a latch circuit. When the weak cell extension threshold flag EWCTF is activated, the address latch circuit 235c may latch the first adjacent address ADJ_ADD<1>, the second adjacent address ADJ_ADD<2>, the first extension adjacent address EADJ_ADD<1>, and the second extension adjacent address EADJ_ADD<2> in a latch circuit. The address latch circuit 235c may output at least one of the latched adjacent address ADJ_ADD and the latched extension adjacent address EADJ_ADD as the target address TADD whenever the target refresh signal TREF is activated.

Figure 15:
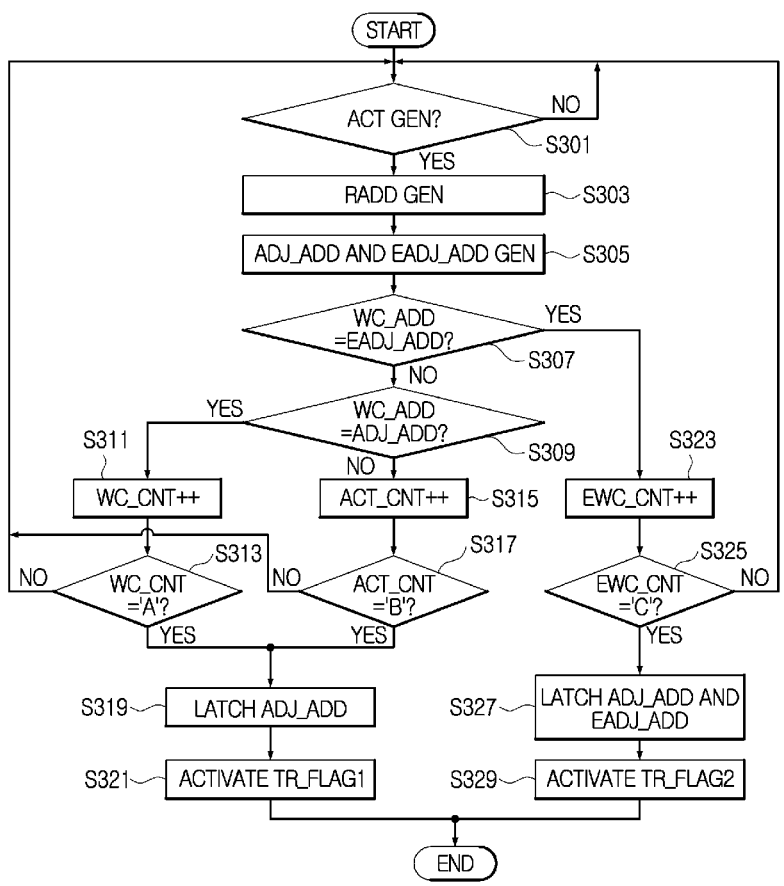
FIG. 15 is a flowchart for describing an active operation performed by the electronic device illustrated in FIG. 12.

FIG. 15 is a flowchart for describing an active operation performed by the electronic device 120c illustrated in FIG. 12.

At S301, the command decoder 201c may generate the active signal ACT whenever the command CMD for performing an active operation is received.

At S303, the address decoder 203c may generate the row address RADD by decoding the address ADD when an active operation is performed.

At S305, the adjacent address generation circuit 205c may generate the first adjacent address ADJ_ADD<1> by subtracting "1" from a value of the row address RADD, and may generate the second adjacent address ADJ_ADD<2> by adding "1" to the value of the row address RADD. Furthermore, the adjacent address generation circuit 205c may generate the first extension adjacent address EADJ_ADD<1> by subtracting "2" from the value of the row address RADD, and may generate the second extension adjacent address EADJ_ADD<2> by adding "2" to the value of the row address RADD.

At S307, the count signal generation circuit 211c may determine whether a value of the weak cell address WC_ADD is identical with one of the values of the first extension adjacent address EADJ_ADD<1> and the second extension adjacent address EADJ_ADD<2>.

When the determination result of S307 indicates that the value of the weak cell address WC_ADD is different from each of the values of the first extension adjacent address EADJ_ADD<1> and the second extension adjacent address EADJ_ADD<2>, at S309, the count signal generation circuit 211c may determine whether the value of the weak cell address WC_ADD is identical with one of the values of the first adjacent address ADJ_ADD<1> and the second adjacent address ADJ_ADD<2>.

When the determination result of S309 indicates that the value of the weak cell address WC_ADD is identical with one of the values of the first adjacent address ADJ_ADD<1> and the second adjacent address ADJ_ADD<2>, at S311, the count signal generation circuit 211c may increase the value of the weak cell count signal WC_CNT by "1."

At S313, the target refresh control circuit 213c may determine whether the weak cell count signal WC_CNT has a first threshold value "A." When the determination result of S313 indicates that a value of the weak cell count signal WC_CNT is smaller than the first threshold value "A," the electronic device 120c may repeatedly perform S301, S303, S305, S307, S309, S311, and S313.

When the determination result of S309 indicates that the value of the weak cell address WC_ADD is different from each of the values of the first adjacent address ADJ_ADD<1> and the second adjacent address ADJ_ADD<2>, at S315, the count signal generation circuit 211c may increase a value of the active count signal ACT_CNT by "1."

At S317, the target refresh control circuit 213c may determine whether the active count signal ACT_CNT has a second threshold value "B." When the determination result of S317 indicates that the value of the active count signal ACT_CNT is smaller than the second threshold value "B," the electronic device 120c may repeatedly perform S301, S303, S305, S307, S309, S315, and S317.

When the determination result of S313 indicates that the weak cell count signal WC_CNT has the first threshold value "A" or the determination result of S319 indicates that the active count signal ACT_CNT has the second threshold value "B," at S319, the target refresh control circuit 213c may latch the first adjacent address ADJ_ADD<1> and the second adjacent address ADJ_ADD<2>. When the determination result of S313 indicates that the weak cell count signal WC_CNT has the first threshold value "A," the target refresh control circuit 213c may reset the value of the weak cell count signal WC_CNT based on the weak cell count reset signal WC_RST. When the determination result of S317 indicates that the active count signal ACT_CNT has the second threshold value "B," the target refresh control circuit 213c may reset the value of the active count signal ACT_CNT based on the active count reset signal ACT_RST.

At S319, the target refresh control circuit 213c may activate the first target refresh flag TR_FLAG1 in order to generate the target refresh signal TREF for performing a refresh operation on the target address TADD.

When the determination result of S307 indicates that the value of the weak cell address WC_ADD is identical with one of the values of the first extension adjacent address EADJ_ADD<1> and the second extension adjacent address EADJ_ADD<2>, at S323, the count signal generation circuit 211c may increase a value of the weak cell extension count signal EWC_CNT by "1."

At S325, the target refresh control circuit 213c may determine whether the weak cell extension count signal EWC_CNT has a third threshold value "C." When the determination result of S325 indicates that the value of the weak cell extension count signal EWC_CNT is smaller than the third threshold value "C," the electronic device 120c may repeatedly perform S301, S303, S305, S307, S323, and S325.

When the determination result of S325 indicates that the weak cell extension count signal EWC_CNT has the third threshold value "C," at S327, the target refresh control circuit 213c may latch the first adjacent address ADJ_ADD<1>, the second adjacent address ADJ_ADD<2>, the first extension adjacent address EADJ_ADD<1>, and the second extension adjacent address EADJ_ADD<2>. When the determination result of S325 indicates that the weak cell extension count signal EWC_CNT has the third threshold value "C," the target refresh control circuit 213c may reset a value of the weak cell extension count signal EWC_CNT based on the weak cell extension count reset signal EWC_RST.

At S329, the target refresh control circuit 213c may activate the second target refresh flag TR_FLAG2 in order to generate the target refresh signal TREF for performing a refresh operation on the target address TADD.

Figure 16:
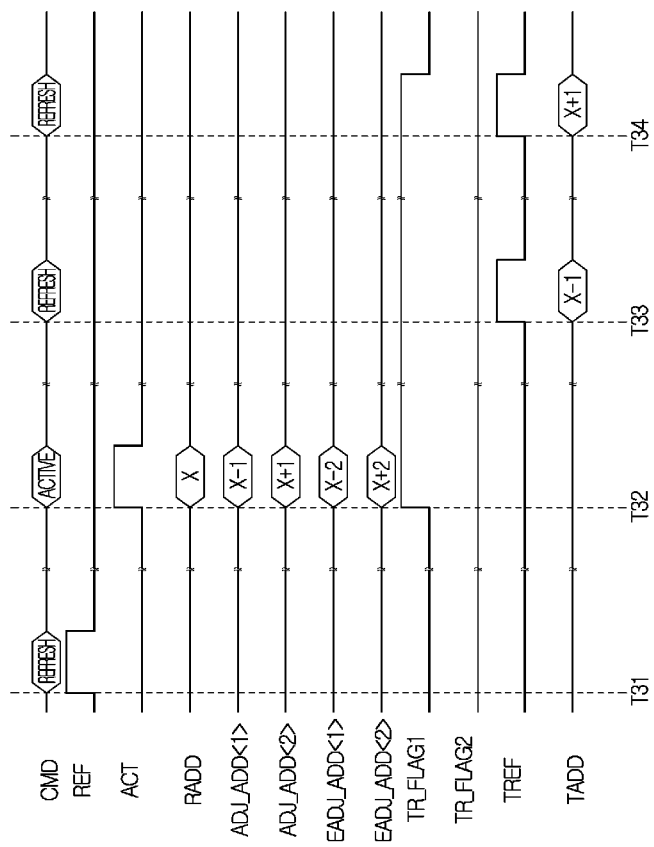
FIGS. 16 and 17 are timing diagrams for describing a refresh operation for a target address, which is performed by the electronic device illustrated in FIG. 12.

FIG. 16 is a timing diagram for describing a refresh operation for the target address TADD generated from the adjacent address ADJ_ADD, which is performed by the electronic device 120c illustrated in FIG. 12.

At T31, the command decoder 201c may activate the refresh signal REF by decoding the command CMD for a refresh operation, based on a deactivated first target refresh flag TR_FLAG1 and a deactivated second target refresh flag TR_FLAG2. When the refresh signal REF is activated, the row control circuit 215c may perform a refresh operation on a memory cell coupled to a word line WL.

At T32, the command decoder 201c may activate the active signal ACT by decoding the command CMD for an active operation. When an active operation is performed, the address decoder 203c may generate the row address RADD having a value "X" by decoding the address ADD. When the active signal ACT is activated, the row control circuit 215c may perform an active operation of activating an X-th word line WL<X> corresponding to the value of the row address RADD.

At T32, when the active operation is performed, the adjacent address generation circuit 205c may generate the first adjacent address ADJ_ADD<1> having a value "X−1" and the second adjacent address ADJ_ADD<2> having a value "X+1" from the row address RADD having the value "X." Furthermore, when the active operation is performed, the adjacent address generation circuit 205c may generate the first extension adjacent address EADJ_ADD<1> having a value "X−2" and the second extension adjacent address EADJ_ADD<2> having a value "X+2," from the row address RADD having the value "X."

At T32, when a value of the weak cell address WC_ADD is different from each of the values of the first extension adjacent address EADJ_ADD<1> and the second extension adjacent address EADJ_ADD<2>, the count signal generation circuit 211c may increase one of the values of the weak cell count signal WC_CNT and the active count signal ACT_CNT by comparing the weak cell address WC_ADD with the first adjacent address ADJ_ADD<1> and the second adjacent address ADJ_ADD<2>. When the weak cell count signal WC_CNT has a first threshold value or the active count signal ACT_CNT has a second threshold value, the target refresh control circuit 213c may latch the first adjacent address ADJ_ADD<1> and the second adjacent address ADJ_ADD<2>, and may activate the first target refresh flag TR_FLAG1.

At T33, the command decoder 201c may activate the target refresh signal TREF for performing a refresh operation on the target address TADD by decoding the command CMD for a refresh operation, based on the activated first target refresh flag TR_FLAG1. When the target refresh signal TREF is activated, the target refresh control circuit 213c may generate the target address TADD having the value "X−1" by outputting the latched first adjacent address ADJ_ADD<1>. When the target refresh signal TREF is activated, the row control circuit 215c may perform a refresh operation on a memory cell coupled to an (X−1)-th word line WL<X−1> corresponding to the value of the target address TADD.

At T34, the command decoder 201c may activate the target refresh signal TREF by decoding the command CMD for a refresh operation, based on the activated first target refresh flag TR_FLAG1. When the target refresh signal TREF is activated, the target refresh control circuit 213c may generate the target address TADD having the value "X+1" by outputting the latched second adjacent address ADJ_ADD<2>. When the target refresh signal TREF is activated, the row control circuit 215c may perform a refresh operation on a memory cell coupled to an (X+1)-th word line WL<X+1> corresponding to the value of the target address TADD. The target refresh control circuit 213c may deactivate the activated first target refresh flag TR_FLAG1 based on the target refresh signal TREF.

Figure 17:
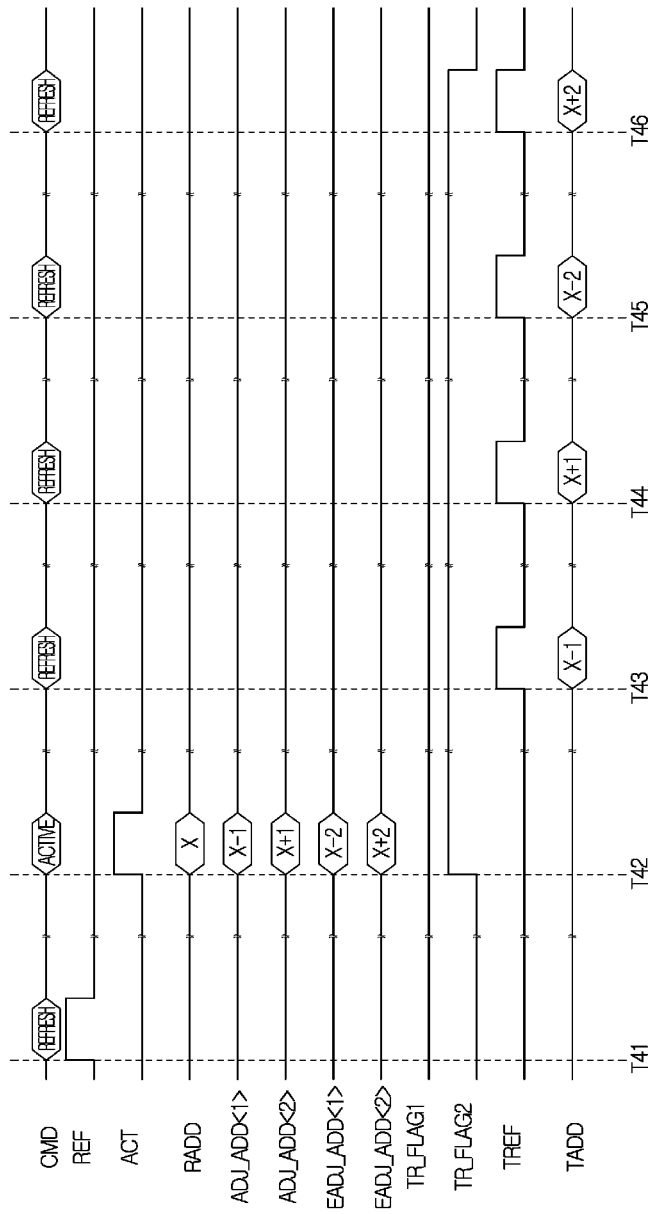

FIG. 17 is a timing diagram for describing a refresh operation for the target address TADD generated from the adjacent address ADJ_ADD and the extension adjacent address EADJ_ADD, which is performed by the electronic device 120c illustrated in FIG. 12.

At T41, the command decoder 201c may activate the refresh signal REF by decoding the command CMD for a refresh operation, based on a deactivated first target refresh flag TR_FLAG1 and a deactivated second target refresh flag TR_FLAG2. When the refresh signal REF is activated, the row control circuit 215c may perform a refresh operation on a memory cell coupled to a word line WL.

At T42, the command decoder 201c may activate the active signal ACT by decoding the command CMD for an active operation. When an active operation is performed, the address decoder 203c may generate the row address RADD having a value "X" by decoding the address ADD. When the active signal ACT is activated, the row control circuit 215c may perform an active operation of activating an X-th word line WL<X> corresponding to the value of the row address RADD.

At T42, when the active operation is performed, the adjacent address generation circuit 205c may generate the first adjacent address ADJ_ADD<1> having a value "X−1" and the second adjacent address ADJ_ADD<2> having a value "X+1," from the row address RADD having the value "X." Furthermore, when the active operation is performed, the adjacent address generation circuit 205c may generate the first extension adjacent address EADJ_ADD<1> having a value "X−2" and the second extension adjacent address EADJ_ADD<2> having a value "X+2," from the row address RADD having the value "X."

At T42, when a value of the weak cell address WC_ADD is identical with one of the values of the first extension adjacent address EADJ_ADD<1> and the second extension adjacent address EADJ_ADD<2>, the count signal generation circuit 211c may increase a value of the weak cell extension count signal EWC_CNT. When the weak cell extension count signal EWC_CNT has a third threshold value, the target refresh control circuit 213c may latch the first adjacent address ADJ_ADD<1>, the second adjacent address ADJ_ADD<2>, the first extension adjacent address EADJ_ADD<1>, and the second extension adjacent address EADJ_ADD<2>, and may activate the second target refresh flag TR_FLAG2.

At T43, the command decoder 201c may activate the target refresh signal TREF for performing a refresh operation on the target address TADD by decoding the command CMD for a refresh operation, based on the activated second target refresh flag TR_FLAG2. When the target refresh signal TREF is activated, the target refresh control circuit 213c may generate the target address TADD having the value "X−1" by outputting the latched first adjacent address ADJ_ADD<1>. When the target refresh signal TREF is activated, the row control circuit 215c may perform a refresh operation on a memory cell coupled to an (X−1)-th word line WL<X−1> corresponding to the value of the target address TADD.

At T44, the command decoder 201c may activate the target refresh signal TREF by decoding the command CMD for a refresh operation, based on the activated second target refresh flag TR_FLAG2. When the target refresh signal TREF is activated, the target refresh control circuit 213c may generate the target address TADD having the value "X+1" by outputting the latched second adjacent address ADJ_ADD<2>. When the target refresh signal TREF is activated, the row control circuit 215c may perform a refresh operation on a memory cell coupled to an (X+1)-th word line WL<X+1> corresponding to the value of the target address TADD.

At T45, the command decoder 201c may activate the target refresh signal TREF by decoding the command CMD for a refresh operation, based on the activated second target refresh flag TR_FLAG2. When the target refresh signal TREF is activated, the target refresh control circuit 213c may generate the target address TADD having the value "X−2" by outputting the latched first extension adjacent address EADJ_ADD<1>. When the target refresh signal TREF is activated, the row control circuit 215c may perform a refresh operation on a memory cell coupled to an (X−2)-th word line WL<X−2> corresponding to the value of the target address TADD.

At T46, the command decoder 201c may activate the target refresh signal TREF by decoding the command CMD for a refresh operation, based on the activated second target refresh flag TR_FLAG2. When the target refresh signal TREF is activated, the target refresh control circuit 213c may generate the target address TADD having the value "X+2" by outputting the latched second extension adjacent address EADJ_ADD<2>. When the target refresh signal TREF is activated, the row control circuit 215c may perform a refresh operation on a memory cell coupled to an (X+2)-th word line WL<X+2> corresponding to the value of the target address TADD. The target refresh control circuit 213c may deactivate the activated second target refresh flag TR_FLAG2 based on the target refresh signal TREF.

Figure 18:
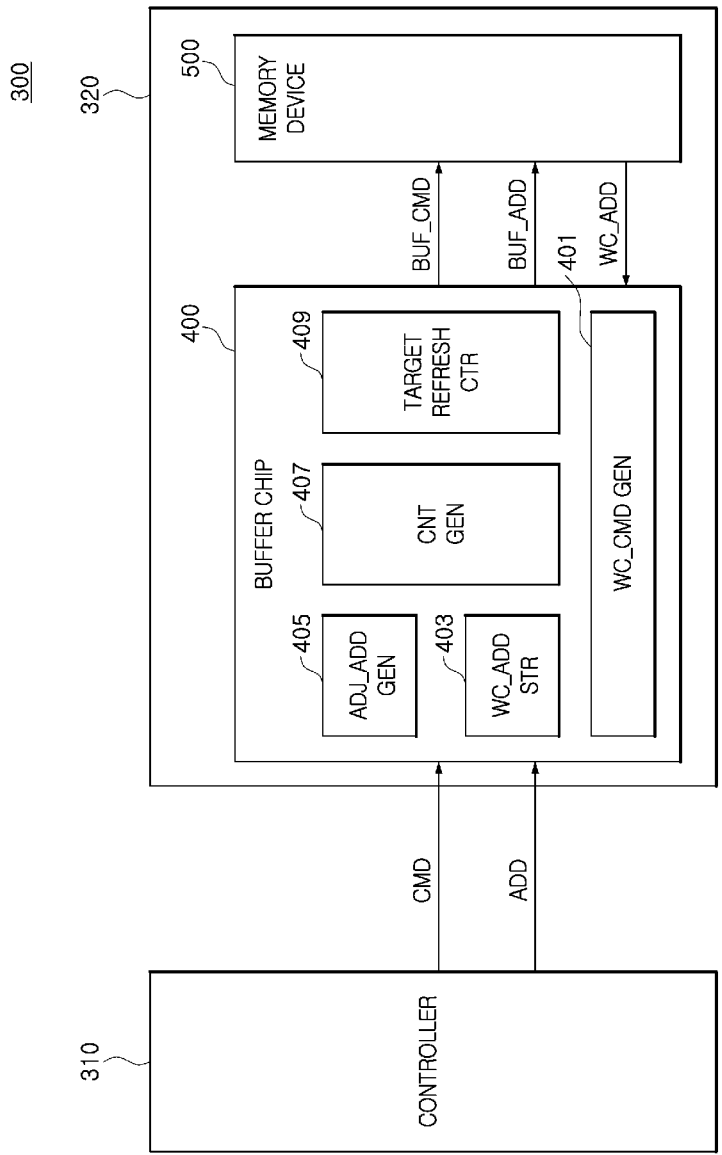
FIG. 18 is a block diagram illustrating a configuration of an electronic system according to another example of the present disclosure.

FIG. 18 is a block diagram illustrating a configuration of an electronic system 300 according to another example of the present disclosure. As illustrated in FIG. 18, the electronic system 300 may include a controller 310 and an electronic device 320. In the present embodiment, the electronic device 320 may be implemented as a memory module including a buffer chip 400 and a memory device 500. The controller 310 may transmit a command CMD and an address ADD to the electronic device 320. The buffer chip 400 may buffer the command CMD received from the controller 310, and may transmit a buffer command BUF_CMD to the memory device 500. The buffer chip 400 may buffer the address ADD received from the controller 310, and may transmit a buffer address BUF_ADD to the memory device 500. The buffer chip 400 may be implemented as a registering clock driver (RCD). The memory device 500 may receive the buffer command BUF_CMD and the buffer address BUF_ADD from the buffer chip 400, and may perform various internal operations, such as an active operation and a refresh operation.

The buffer chip 400 may include a weak cell command generation circuit (WC_CMD GEN) 401, a weak cell address storage circuit (WC_ADD STR) 403, an adjacent address generation circuit (ADJ_ADD GEN) 405, a count signal generation circuit (CNT GEN) 407, and a target refresh control circuit (TARGET REFRESH CTR) 409.

The weak cell command generation circuit 401 may generate the buffer command BUF_CMD for receiving a weak cell address WC_ADD from the memory device 500, based on the command CMD received from the controller 310. For example, when the command CMD is received from the controller 310 for the first time, the weak cell command generation circuit 401 may generate the buffer command BUF_CMD for receiving the weak cell address WC_ADD from the memory device 500.

The weak cell address storage circuit 403 may receive the weak cell address WC_ADD from the memory device 500 based on the buffer command BUF_CMD generated by the weak cell command generation circuit 401, and may store the received weak cell address WC_ADD.

When the command CMD for an active operation is received from the controller 310, the adjacent address generation circuit 405 may generate adjacent addresses corresponding to word lines adjacent to a word line activated upon active operation, based on the address ADD. A configuration and operating method of the adjacent address generation circuit 405 may be implemented identically with those of the adjacent address generation circuit 205 illustrated in FIG. 1.

The count signal generation circuit 407 may compare the weak cell address WC_ADD, stored in the weak cell address storage circuit 403, with an adjacent address generated by the adjacent address generation circuit 405. When a value of the weak cell address WC_ADD is identical with a value of the adjacent address, the count signal generation circuit 407 may count the number of active operations executed, for each weak cell address WC_ADD. On the contrary, when the value of the weak cell address WC_ADD is different from the value of the adjacent address, the count signal generation circuit 407 may separately count the number of active operations executed. A configuration and operating method of the count signal generation circuit 407 may be implemented identically with those of the count signal generation circuit 211 illustrated in FIG. 1.

The target refresh control circuit 409 may control a refresh operation to be performed on a memory cell coupled to a word line adjacent to a word line that is repeatedly activated, based on the number of active operations executed that has been counted for each weak cell address WC_ADD and the number of active operations executed that has been separately counted. A configuration and operating method of the target refresh control circuit 409 may be implemented identically with those of the target refresh control circuit 213 illustrated in FIG. 1.

What is claimed is:

1. An electronic device comprising:
    a count signal generation circuit configured to increase one of values of a weak cell count signal and an active count signal by comparing a weak cell address with an adjacent address generated from a row address, when an active operation is performed; and
    a target refresh control circuit configured to:
    latch the adjacent address based on the values of the weak cell count signal and the active count signal, and
    output the latched adjacent address as a target address for a refresh operation based on a target refresh signal,
    wherein, the weak cell address is a location of a weak cell, which is a memory cell with relatively low data retention characteristics.

2. The electronic device of claim 1, wherein:
    the adjacent address comprises a first adjacent address and a second adjacent address, and
    the electronic device further comprises an adjacent address generation circuit configured to:
    generate the first adjacent address by subtracting one (1) from the value of the row address, and
    generate the second adjacent address by adding one (1) to the value of the row address.

3. The electronic device of claim 1, wherein the count signal generation circuit is configured to:
    increase the value of the weak cell count signal when a value of the weak cell address is identical with a value of the adjacent address, and
    increase the value of the active count signal when the value of the weak cell address is different from the value of the adjacent address.

4. The electronic device of claim 3, wherein the target refresh control circuit is configured to:
    latch the adjacent address when the weak cell count signal has a first threshold value or the active count signal has a second threshold value, and
    output, as the target address, at least one of the latched adjacent addresses when the target refresh signal is activated.

5. The electronic device of claim 4, wherein the target refresh control circuit is configured to:
    reset the value of the weak cell count signal when the weak cell count signal has the first threshold value, and
    reset the value of the active count signal when the active count signal has the second threshold value.

6. The electronic device of claim 4, wherein:
    the target refresh control circuit is configured to activate a target refresh flag when the weak cell count signal has the first threshold value or the active count signal has the second threshold value, and
    the target refresh signal is activated based on a command for performing the refresh operation in an interval of time during which the target refresh flag is activated.

7. The electronic device of claim 3, wherein:
    the weak cell address comprises a first weak cell address and a second weak cell address,
    the weak cell count signal comprises a first weak cell count signal and a second weak cell count signal, and
    the count signal generation circuit is configured to:
    increase a value of the first weak cell count signal when the value of the first weak cell address is identical with the value of the adjacent address, and
    increase a value of the second weak cell count signal when the value of the second weak cell address is identical with the value of the adjacent address.

8. The electronic device of claim 7, further comprising a weak cell address storage circuit configured to:
    receive, from a fuse array, the first and second weak cell addresses respectively corresponding to first and second word lines to which a weak cell is coupled, and
    store the first and second weak cell addresses.

* * * * *